United States Patent
Lee et al.

(10) Patent No.: US 9,400,750 B2
(45) Date of Patent: Jul. 26, 2016

(54) NONVOLATILE MEMORY DEVICE AND NONVOLATILE MEMORY SYSTEM AND RANDOM DATA READ METHOD THEREOF

(71) Applicant: SAMSUNG ELECTRONICS CO., LTD., Suwon-Si, Gyeonggi-Do (KR)

(72) Inventors: Kijun Lee, Seoul (KR); Jaehong Kim, Seoul (KR); Sejin Lim, Seoul (KR); Jungsoo Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/472,072

(22) Filed: Aug. 28, 2014

(65) Prior Publication Data

US 2014/0372714 A1 Dec. 18, 2014

Related U.S. Application Data

(63) Continuation of application No. 13/450,541, filed on Apr. 19, 2012, now Pat. No. 8,856,428.

(30) Foreign Application Priority Data

Apr. 19, 2011 (KR) .................. 10-2011-0036350

(51) Int. Cl.
| | | |
|---|---|---|
| *G06F 12/00* | (2006.01) | |
| *G06F 13/00* | (2006.01) | |
| *G06F 13/28* | (2006.01) | |
| *G06F 12/06* | (2006.01) | |
| *G06F 7/58* | (2006.01) | |
| *G11C 16/00* | (2006.01) | |
| *G06F 11/10* | (2006.01) | |
| *G06F 12/02* | (2006.01) | |
| *G11C 7/10* | (2006.01) | |
| *H03M 13/03* | (2006.01) | |

(52) U.S. Cl.
CPC ........ *G06F 12/06* (2013.01); *G06F 7/58* (2013.01); *G06F 11/1008* (2013.01); *G06F 11/1012* (2013.01); *G06F 11/1044* (2013.01); *G06F 11/1048* (2013.01); *G06F 12/0246* (2013.01); *G11C 7/1006* (2013.01); *G11C 16/00* (2013.01); *G06F 2212/251* (2013.01); *H03M 13/03* (2013.01)

(58) Field of Classification Search
CPC .................... G06F 11/1008; G06F 12/0246
USPC ................................... 711/103, 154
See application file for complete search history.

(56) References Cited

U.S. PATENT DOCUMENTS

| | | | |
|---|---|---|---|
| 2006/0256962 | A1 | 11/2006 | Ilnicki et al. |
| 2010/0070682 | A1 | 3/2010 | Wan et al. |
| 2010/0088574 | A1 | 4/2010 | Kim et al. |
| 2010/0229007 | A1 | 9/2010 | Park |

FOREIGN PATENT DOCUMENTS

| | | |
|---|---|---|
| JP | 2001-339385 | 12/2001 |
| JP | 2008-059177 | 3/2008 |
| JP | 2009-258141 | 11/2009 |

*Primary Examiner* — Ryan Bertram
(74) *Attorney, Agent, or Firm* — Volentine & Whitt, PLLC

(57) ABSTRACT

A random data reading method of a nonvolatile memory device includes receiving an initial seed corresponding to a selected page of the nonvolatile memory device and relative location information of read-requested random data in the selected page. The method further includes generating a seed for randomizing the random data by subjecting the initial seed and the location information to a finite field arithmetic operation, and de-randomizing the random data based on a random sequence generated from the seed.

23 Claims, 28 Drawing Sheets

Fig. 5B

| | RS | | | |
|---|---|---|---|---|
| T | $D_0$ | $D_1$ | $D_2$ | $D_3$ |
| 0 | 1 | 0 | 0 | 0 |
| 1 | 0 | 1 | 0 | 0 |
| 2 | 0 | 0 | 1 | 0 |
| 3 | 1 | 0 | 0 | 1 |
| 4 | 1 | 1 | 0 | 0 |
| 5 | 0 | 1 | 1 | 0 |
| 6 | 1 | 0 | 1 | 1 |
| 7 | 0 | 1 | 0 | 1 |
| 8 | 1 | 0 | 1 | 0 |
| 9 | 1 | 1 | 0 | 1 |
| 10 | 1 | 1 | 1 | 0 |
| 11 | 1 | 1 | 1 | 1 |
| 12 | 0 | 1 | 1 | 1 |
| 13 | 0 | 0 | 1 | 1 |
| 14 | 0 | 0 | 0 | 1 |
| 15 | 1 | 0 | 0 | 0 |
| 16 | 0 | 1 | 0 | 0 |

⟷

Galois Field $GF(2^4)$

| - | $\alpha^0$ | $\alpha^1$ | $\alpha^2$ | $\alpha^3$ |
|---|---|---|---|---|
| $\alpha^0$ | 1 | 0 | 0 | 0 |
| $\alpha^1$ | 0 | 1 | 0 | 0 |
| $\alpha^2$ | 0 | 0 | 1 | 0 |
| $\alpha^3$ | 0 | 0 | 0 | 1 |
| $\alpha^4$ | 1 | 1 | 0 | 0 |
| $\alpha^5$ | 0 | 1 | 1 | 0 |
| $\alpha^6$ | 0 | 0 | 1 | 1 |
| $\alpha^7$ | 1 | 1 | 0 | 1 |
| $\alpha^8$ | 1 | 0 | 1 | 0 |
| $\alpha^9$ | 0 | 1 | 0 | 1 |
| $\alpha^{10}$ | 1 | 1 | 1 | 0 |
| $\alpha^{11}$ | 0 | 1 | 1 | 1 |
| $\alpha^{12}$ | 1 | 1 | 1 | 1 |
| $\alpha^{13}$ | 1 | 0 | 1 | 1 |
| $\alpha^{14}$ | 1 | 0 | 0 | 1 |
| $\alpha^{15}=\alpha^0$ | 1 | 0 | 0 | 0 |
| $\alpha^{16}=\alpha^1$ | 0 | 1 | 0 | 0 |

Repeat

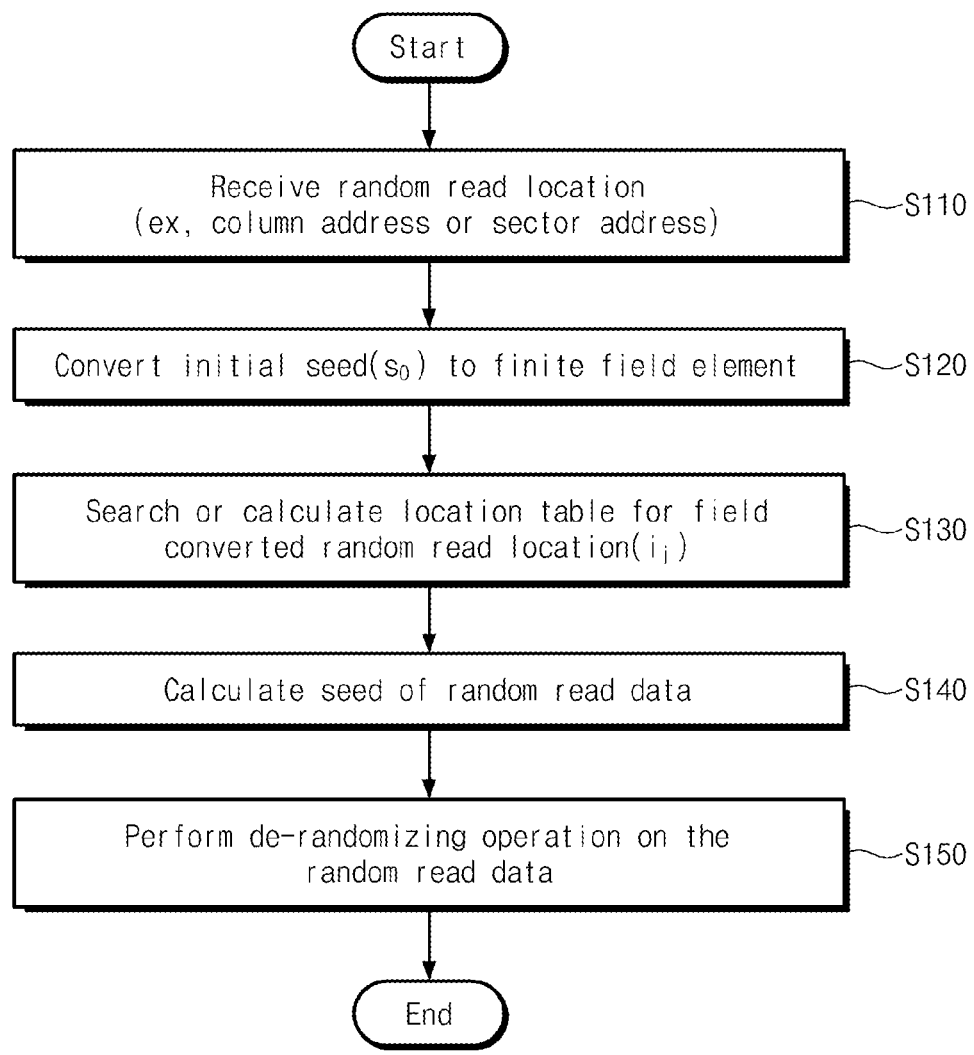

Fig. 12B

| RS | | | | | | Galois Field GF($2^4$) | | | | |
|---|---|---|---|---|---|---|---|---|---|---|
| T | $D_0$ | $D_1$ | $D_2$ | $D_3$ | | - | $\alpha^0$ | $\alpha^1$ | $\alpha^2$ | $\alpha^3$ |
| 0 | 1 | 0 | 0 | 0 | | $\alpha^0$ | 1 | 0 | 0 | 0 |
| 1 | 0 | 1 | 0 | 0 | | $\alpha^1$ | 0 | 1 | 0 | 0 |
| 2 | 0 | 0 | 1 | 0 | | $\alpha^2$ | 0 | 0 | 1 | 0 |
| 3 | 1 | 0 | 0 | 1 | | $\alpha^3$ | 1 | 0 | 0 | 1 |
| 4 | 1 | 1 | 0 | 0 | | $\alpha^4$ | 1 | 1 | 0 | 0 |
| 5 | 0 | 1 | 1 | 0 | | $\alpha^5$ | 0 | 1 | 1 | 0 |
| 6 | 0 | 0 | 1 | 1 | | $\alpha^6$ | 0 | 0 | 1 | 1 |
| 7 | 1 | 1 | 0 | 1 | = | $\alpha^7$ | 1 | 1 | 0 | 1 |
| 8 | 1 | 0 | 1 | 0 | | $\alpha^8$ | 1 | 0 | 1 | 0 |
| 9 | 0 | 1 | 0 | 1 | | $\alpha^9$ | 0 | 1 | 0 | 1 |
| 10 | 1 | 1 | 1 | 0 | | $\alpha^{10}$ | 1 | 1 | 1 | 0 |
| 11 | 0 | 1 | 1 | 1 | | $\alpha^{11}$ | 0 | 1 | 1 | 1 |
| 12 | 1 | 1 | 1 | 1 | | $\alpha^{12}$ | 1 | 1 | 1 | 1 |
| 13 | 1 | 0 | 1 | 1 | | $\alpha^{13}$ | 1 | 0 | 1 | 1 |
| 14 | 1 | 0 | 0 | 1 | Repeat | $\alpha^{14}$ | 1 | 0 | 0 | 1 |
| 15 | 1 | 0 | 0 | 0 | | $\alpha^{15}=\alpha^0$ | 1 | 0 | 0 | 0 |
| 16 | 0 | 1 | 0 | 0 | | $\alpha^{16}=\alpha^1$ | 0 | 1 | 0 | 0 |

Fig. 16

Location Table

| $\beta_0$ | $\beta_1$ | $\beta_2$ | $\beta_3$ | $\beta_4$ |
|---|---|---|---|---|
| $1=\alpha^{0 \times 1024B}$ | $1=\alpha^{0 \times 128B}$ | $1=\alpha^{0 \times 16B}$ | $1=\alpha^{0 \times 2B}$ | $1=\alpha^{0 \times B}$ |
| $\alpha^{1 \times 1024B}$ | $\alpha^{1 \times 128B}$ | $\alpha^{1 \times 16B}$ | $\alpha^{1 \times 2B}$ | $\alpha^{1 \times B}$ |
| $\alpha^{2 \times 1024B}$ | $\alpha^{2 \times 128B}$ | $\alpha^{2 \times 16B}$ | $\alpha^{2 \times 2B}$ | — |
| $\alpha^{3 \times 1024B}$ | $\alpha^{3 \times 128B}$ | $\alpha^{3 \times 16B}$ | $\alpha^{3 \times 2B}$ | — |
| $\alpha^{4 \times 1024B}$ | $\alpha^{4 \times 128B}$ | $\alpha^{4 \times 16B}$ | $\alpha^{4 \times 2B}$ | — |
| $\alpha^{5 \times 1024B}$ | $\alpha^{5 \times 128B}$ | $\alpha^{5 \times 16B}$ | $\alpha^{5 \times 2B}$ | — |
| $\alpha^{6 \times 1024B}$ | $\alpha^{6 \times 128B}$ | $\alpha^{6 \times 16B}$ | $\alpha^{6 \times 2B}$ | — |
| $\alpha^{7 \times 1024B}$ | $\alpha^{7 \times 128B}$ | $\alpha^{7 \times 16B}$ | $\alpha^{7 \times 2B}$ | — |

$\alpha$ : primitive element

Fig. 17

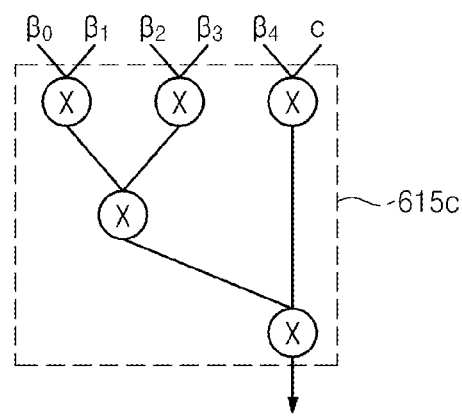

$c\alpha^t = c \times \beta_0 \times \beta_1 \times \beta_2 \times \beta_3 \times \beta_4$
$S_{(t)} = Tr_1^n(c\alpha^t)$

NONVOLATILE MEMORY DEVICE AND NONVOLATILE MEMORY SYSTEM AND RANDOM DATA READ METHOD THEREOF

CROSS-REFERENCE TO RELATED APPLICATIONS

This application is a Continuation of U.S. application Ser. No. 13/450,541, filed Apr. 19, 2012, a claim of priority under 35 U.S.C. §119 is made to Korean Patent Application No. 10-2011-0036350 filed Apr. 19, 2011, the entirety of which is incorporated by reference herein.

BACKGROUND

Exemplary embodiments relate to a semiconductor memory device, and more particularly, exemplary embodiments relate to a nonvolatile memory device and to a method of reading a nonvolatile memory device.

Non-volatile memory devices retain stored data in the absence of supplied power. Examples of non-volatile memory devices include flash memory (e.g., NAND flash and NOR flash memories), Phase change Random Access Memory (PRAM), a Magnetroresistive Random Access Memory (MRAM), a Ferroelectric Random Access Memory (FRAM), a Resistance Random Access Memory (RRAM), a Spin transfer Torque Random Access Memory (STT-RAM), and so on.

Among these, the flash memory device is a type of EEPROM (Electrically Programmable Erasable Read Only Memory) in which a plurality of memory regions are erased or programmed by one program operation. This is in contrast to a conventional EEPROM which enables only one memory region to be erased or programmed at a time. As such, systems adopting a flash memory device can operative at relatively high speeds by executing read and write operations on different memory regions simultaneously.

As mentioned above, flash memory devices are non-volatile in that they retained stored data in the absence of supplied power. That is, a flash memory device fabricated on a silicon chip retains stored information even when the supply of power to the chip is interrupted. This results in an effective means to reduce power consumption. In addition, a flash memory device exhibits a relatively high resistance to physical impact. These characteristics, together with high speed access times and the like, have resulted in the flash memory device being commonly utilized for data storage in battery-powered and portable appliances.

SUMMARY

One aspect of embodiments of the inventive concept is directed to a random data reading method of a nonvolatile memory device includes receiving an initial seed corresponding to a selected page of the nonvolatile memory device and relative location information of read-requested random data in the selected page, generating a seed for randomizing the random data by subjecting the initial seed and the location information to a finite field arithmetic operation, and de-randomizing the random data based on a random sequence generated from the seed.

Another aspect of embodiments of the inventive concept is directed to a method of reading data from a non-volatile memory device includes receiving a read address of the data to be read, the read address denoting a segment of a selected memory page of the non-volatile memory device. The method further includes determining a location information from the read address, determining an initial seed corresponding to the selected memory page, and applying the location information and the initial seed to a finite field arithmetic operation to determine a seed for the segment of the selected memory page. The method further includes outputting randomized data from the segment of the selected memory page, and de-randomizing the randomized data to obtain the data to be read, where the de-randomizing is executed using the seed for the segment determined by the field arithmetic operation.

Another aspect of embodiments of the inventive concept is directed to a a nonvolatile memory device includes an array including memory cells arranged in rows and columns, and a randomizing and de-randomizing circuit configured to randomize data to be stored in the array and to de-randomize data to be read from the array. Upon execution of a random read operation, the randomizing and de-randomizing circuit is configured to generate a seed based on an initial seed of a page of the array including read-requested random data and location information of the read-requested random data, and to de-randomize the read-requested random data based on a random sequence generated from the seed. The seed is generated by a finite field arithmetic operation and without driving a sequence generator.

BRIEF DESCRIPTION OF THE FIGURES

The above and other objects and features will become apparent from the detailed description that follows with reference to the accompanying figures, wherein like reference numerals refer to like parts throughout the various figures unless otherwise specified, and wherein

FIGS. 5A and 5B are diagrams for describing a sequence generator in FIG. 4.

FIG. 9 is a flowchart for describing a de-randomizing method according to an exemplary embodiment of the inventive concept.

FIGS. 12A and 12B are diagrams for describing a sequence generator in FIG. 10.

FIG. 16 is a diagram illustrating finite field location information described in FIG. 15.

FIG. 17 is a diagram illustrating a seed offset calculator of calculating a finite field conversion value $\alpha'$ described in FIG. 16 and a seed offset.

DETAILED DESCRIPTION

Figure 1:
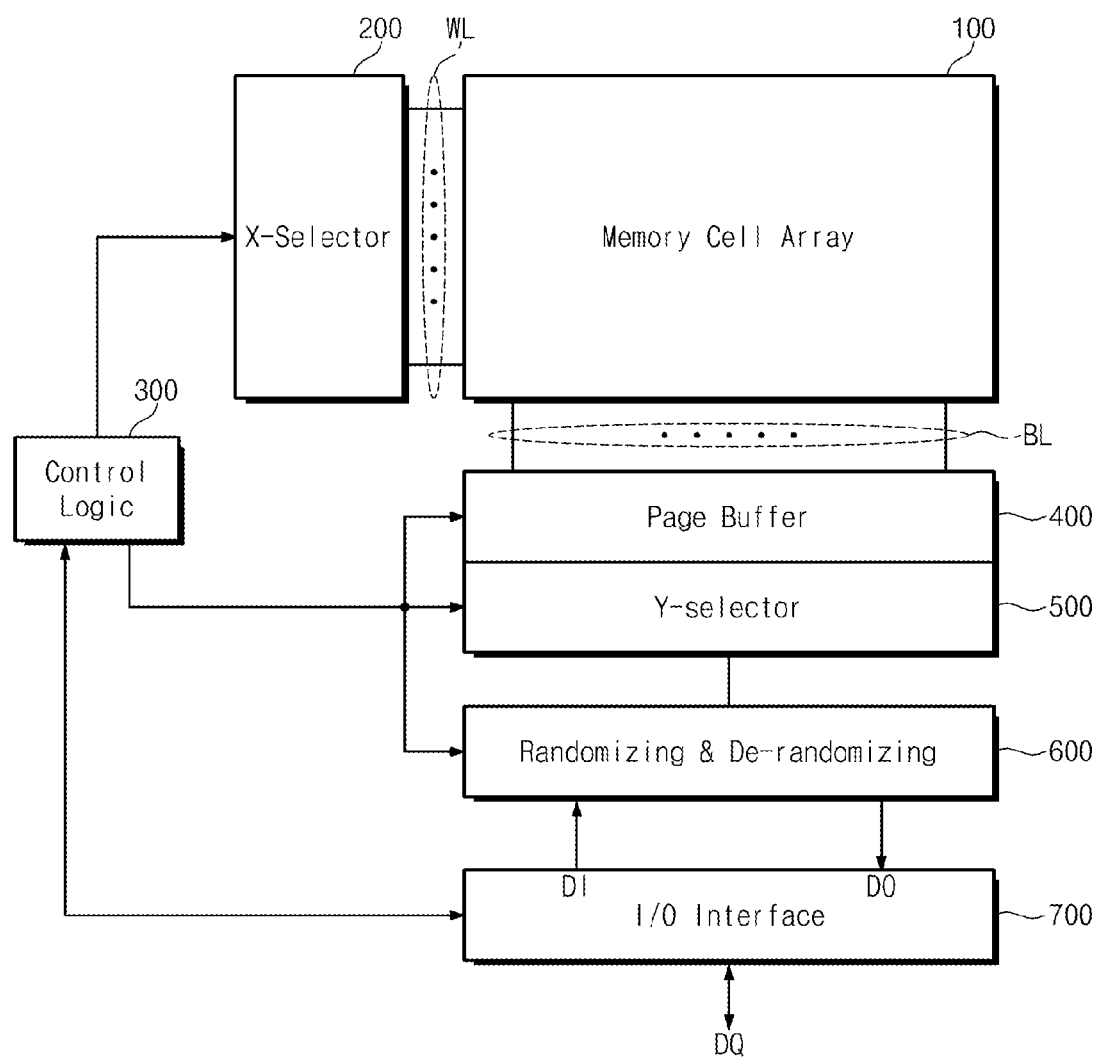
FIG. 1 is a block diagram illustrating a flash memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a flash memory device according to an exemplary embodiment of the inventive concept. Referring to FIG. 1, a flash memory device may be a NAND flash memory device, for example. However, the inventive concept is not limited thereto. For example, the inventive concept may be applied to other types of nonvolatile memory devices such as a PRAM (Phase change Random Access Memory), an MRAM (Magnetroresistive Random Access Memory), an FRAM (Ferroelectric Random Access Memory), an RRAM (Resistance Random Access Memory), an STT-RAM (Spin transfer Torque Random Access Memory), and the like.

The flash memory device may include a memory cell array 100 which has memory cells arranged in rows (or, word lines WL) and columns (or, bit lines BL). Each memory cell may store 1-bit data or M-bit data (M being an integer of 2 or more).

In the event that each memory cell stores 1-bit data, memory cells in each row of the memory cell array 100 may constitute a defined memory space, for example, one page of data.

In the event that each memory cell stores M-bit data, memory cells in each row of the memory cell array 100 may constitute multiple memory spaces, such as multiple pages of data each defined by a respective bit of the memory cells.

Each memory cell may be implemented by a memory cell having a charge storing layer such as a floating gate or a charge trap layer or a memory cell having a variable resistance element. The memory cell array 100 may be configured to have a single-layer array structure (or, a two-dimensional array structure) or a multi-layer array structure (or, a vertical-type or a stack-type three-dimensional (3D) array structure).

A row selector circuit 200 may be controlled by control logic 300, and may be configured to select and drive rows in the memory cell array 100.

The control logic 300 may be configured to control an overall operation of the flash memory device.

A page buffer circuit 400 may be controlled by the control logic 300, and may operate as a sense amplifier or a write driver according to a mode of operation. For example, at reading, the page buffer circuit 400 may operate as a sense amplifier which senses data from memory cells in a selected row. At programming, the page buffer circuit 400 may operate as a write driver which drives memory cells in a selected row according to program data. The page buffer circuit 400 may include page buffers each corresponding to bit lines or bit line pairs. If each memory cell stores multi-bit data, each page buffer of the page buffer circuit 400 may be configured to have two or more latches.

A column selector circuit 500 may be controlled by the control logic 300, and may select columns (or, page buffers) sequentially by a given unit during programming/reading operations.

A randomizing and de-randomizing circuit 600 may be configured to randomize data (i.e., data to be programmed or original data) transferred via an input/output interface 700 under the control of the control logic 300. The randomizing and de-randomizing circuit 600 may be configured to de-randomize data (i.e., randomized data) of the page buffer circuit 400 transferred via the column selector circuit 500 under the control of the control logic 300. The randomizing and de-randomizing circuit 600 according to an exemplary embodiment of the inventive concept may be configured to de-randomize random read data which is smaller in size than a full page of data, i.e., a segment of a page of data. Examples a segment include of a spare region of a page, sector data of a page, data which is larger than a sector data but smaller, data which is smaller than a sector, and so on.

The randomizing and de-randomizing circuit 600 may be configured to generate a seed of random read data for performing a de-randomizing operation at a random read operation without the need to drive a sequence generator. Accordingly, when data smaller in size than page data is processed by a random read operation, it is possible to perform a de-randomizing operation at a relatively high speed. This will be more fully described below.

A memory cell may have any one of $2^N$ threshold voltage distributions (N indicating the number of data bits stored in a memory cell) according to the amount of charges stored in a charge storing means. A threshold voltage (or, a threshold voltage distribution) of a memory cell may vary due to coupling (or, called the word line coupling) generated between adjacent memory cells. By data randomization of the inventive concept, it is possible to reduce variations of threshold voltages of memory cells caused by word line coupling. In other words, since states of memory cells are distributed uniformly, a level of the word line coupling generated between memory cells may be relatively alleviated as compared with that before data randomization. That is, variations of threshold voltages of memory cells may be suppressed. This can advantageously result in an improved read margin.

In some embodiments, the randomizing and de-randomizing operations may be performed selectively. For example, when an access to specific data or a specific region is requested, the randomizing and de-randomizing circuit 600 may be configured to perform its randomizing and de-randomizing operations. The randomizing and de-randomizing circuit 600 may be configured such that data input via the input/output interface 700 is transferred to the page buffer circuit 400 without a randomizing operation of the randomizing and de-randomizing circuit 600. Afterwards, randomizing on data loaded on the page buffer circuit 400 may be made via the randomizing and de-randomizing circuit 600 under the control of the control logic 300.

Figure 2:
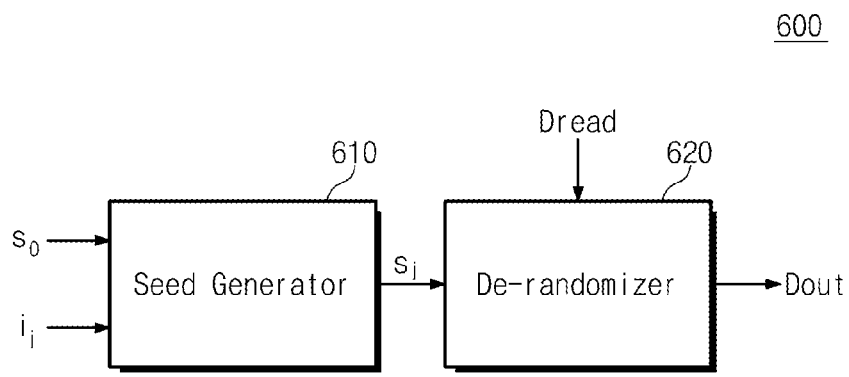
FIG. 2 is a block diagram illustrating a randomizing and de-randomizing circuit in FIG. 1.

FIG. 2 is a block diagram illustrating a randomizing and de-randomizing circuit in FIG. 1. Referring to FIG. 2, a randomizing and de-randomizing circuit 600 may include a seed generator 610 and a de-randomizer 620. The randomizing and de-randomizing circuit 600 may provide a seed for de-randomizing random read data at relatively high speed using the seed generator 610 and the de-randomizer 620. Herein, the random read operation may indicate a read operation performed from a specific point of a read unit (e.g., a page), and the random read data may indicate data read by the random read operation.

The seed generator 610 may provide a seed $S_j$ corresponding to a random read location based upon an initial seed $S_0$ and random read location information $i_j$. In a typical read operation, data may be provided by a read unit, that is, by a page unit. One initial seed $S_0$ may be assigned to one page. A random sequence RS generated by a sequence generator using an initial seed $S_0$ may be used to de-randomize a whole page.

A random read request may be issued not only by a page unit but also by a segment of a page unit (e.g., a sector unit) which is smaller than the page unit. Accordingly, an access point of random read-requested data may be located at the center of a page or at a rear portion of the page. In this case, it is necessary to drive a sequence generator using an initial seed $S_0$ as an initial value by a clock number corresponding to a random read location to obtain a seed $S_j$ for a de-randomizing operation. This may cause a significant delay in performing a random read operation. On the other hand, in the event that seeds $S_j$ each corresponding to sectors are stored in a spare region or a memory region, there may be needed a large data region to store seeds on all pages.

The randomizing and de-randomizing circuit 600 according to an exemplary embodiment of the inventive concept may be configured such that one initial seed $S_0$ corresponding to one page is stored. At a random read request, a seed $S_j$ may be calculated using an initial seed $S_0$ assigned to a read-requested page and location information corresponding to a start point of the random read-requested data. For example, it is possible to generate a seed $S_j$ from an initial seed $S_0$ of a page including a random read-requested sector and location information $i_j$ thereof without the time-consuming utilization of a sequence generator.

Herein, the location information $i_j$ may be provided relatively quickly using a table (not shown). The seed generator 610 may generate a seed $S_j$ of a read-requested location relatively quickly as compared to the use of a sequence generator. For example, the seed generator 610 may generate a seed value $S_j$ using Galois field arithmetic on an initial seed $S_0$ assigned to a page and random read location information $i_j$.

The de-randomizer 620 may generate a random sequence for de-randomizing random read data Dread using a seed $S_j$ provided from the seed generator 610. The de-randomizer 620 may output de-randomized data Dout by mixing the random sequence RS and the random read data Dread. For example, the de-randomized data may be output by exclusive OR (XOR) operation between the random sequence RS and the random read data Dread.

With the above description, the seed generator 610 may generate a seed $S_j$ of random read-requested data using an initial seed $S_0$ assigned to a page and location information of random read-requested data. In particular, in the event that a random read operation is requested in a sector unit, location information of all sectors may be applied identically to all pages. Accordingly, a relative size of location information on each sector may be reduced. Accordingly, it is possible to efficiently generate a seed using a location information table.

Figure 3:
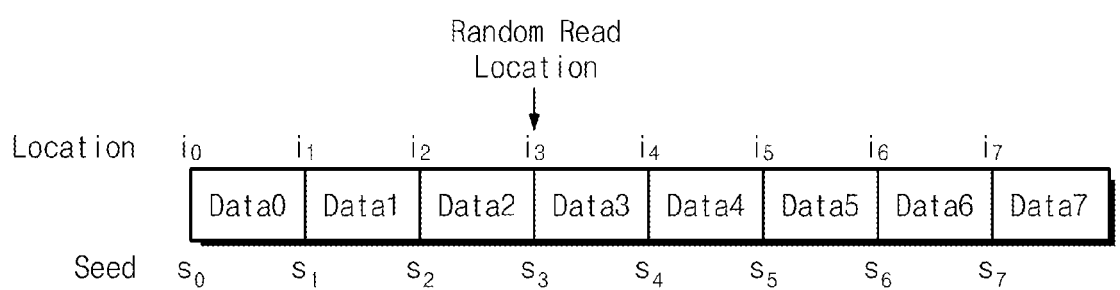
FIG. 3 is a diagram showing random read location information and random seeds corresponding to the random read location information.

FIG. 3 is a diagram showing random read location information and random seeds corresponding to the random read location information. Referring to FIG. 3, there is exemplarily shown one page formed of a plurality of data units (e.g., a sector).

A flash memory device may include a plurality of memory spaces. For ease of description, only one memory space is shown in FIG. 3. A memory space may correspond to one page, for example. A memory space, that is, a page may be formed of sectors each having a size defined by a user. A sector size may be variously determined. For example, one sector may be determined to have a size of 1 KB. A random read operation of the flash memory device may be made in a sector unit. However, a unit of the random read operation is not limited thereto.

One initial seed $S_0$ may be assigned to one page to randomize and de-randomize data. At a random read request, an access point may be set to a start location $i_0$ of a page or to one of the remaining locations $i_1$ to $i_7$. If an access to random read-requested data is made from data Data3, it is necessary to drive a sequence generator using an initial seed $S_0$ in order to generate a seed $S_3$ of the data Data3. That is, the sequence generator may be driven during a cycle corresponding to a size of three sectors Data0, Data1, and Data2 using the initial seed $S_0$.

However, in the case of the inventive concept, a seed value $S_3$ of read-requested random data Data3 may be obtained using the initial seed $S_0$ and random read location information $i_3$ without driving sequence generator. The random read location information $i_j$ may be applied identically to all pages. Although different initial seeds S0 are assigned to pages, the location information $i_j$ of sectors indicating a relative location from a start point $i_0$ of a page may be identical to each other. It is assumed that one page is formed of 8 sectors. In this case, if seven location information $i_1$ to $i_7$ may be stored in a table of a chip, it is possible to obtain a seed on a specific sector almost immediately.

Figure 4:
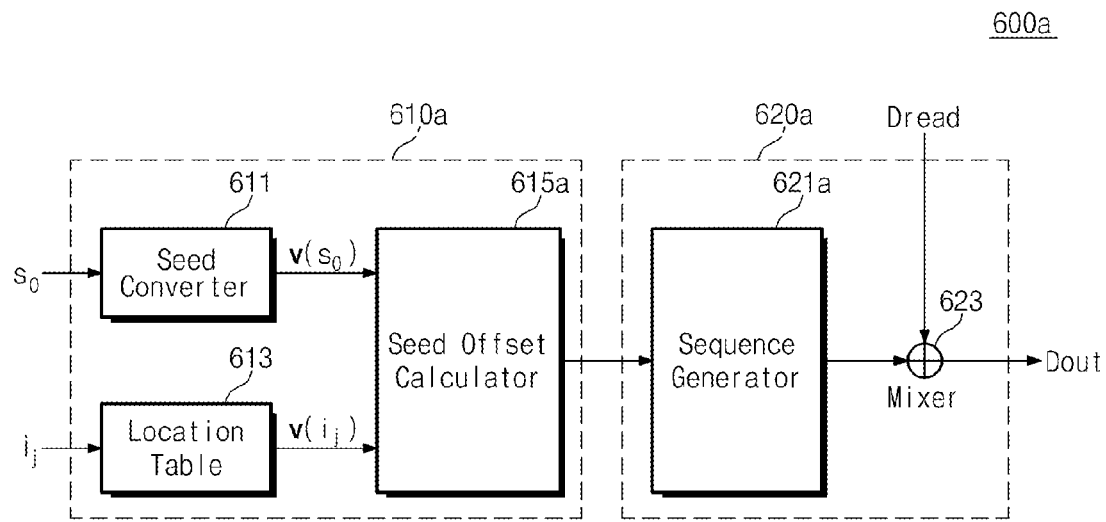
FIG. 4 is a block diagram illustrating a randomizing and de-randomizing circuit according to an exemplary embodiment of the inventive concept.

FIG. 4 is a block diagram illustrating a randomizing and de-randomizing circuit according to an exemplary embodiment of the inventive concept. Referring to FIG. 4, a randomizing and de-randomizing circuit 600a may include a sequence generator 621a which is driven according to a Fibonacci Configuration.

A seed generator 610a may provide a seed $S_j$ corresponding to a random read location based upon an initial seed $S_0$ and random read location information $i_j$. The seed generator 610a may include a seed converter 611, a location table 613, and a seed offset calculator 615a.

The seed converter 611 may convert an initial seed $S_0$ generated by the Fibonacci Configuration into a finite field element. For example, the seed converter 611 may convert an initial seed $S_0$ assigned to each page into a Galois field vector $V(S_0)$. This will be more fully described with reference to FIG. 5B.

The location table 613 may store location information $i_j$ of a corresponding sector at a random read request. For example, at a random read request, a start location provided in a sector unit may be one of location information $i_0$ to $i_7$. The location information $i_0$ to $i_7$ may have the same values with respect to all pages. This is because a sector location is a relative value identically applied to each page, not an absolute value of a memory region. Accordingly, although initial seeds $S_0$ of pages are different, random read location information $i_j$ of sectors at the same location may be identical. In the event that one page is formed of eight sectors, although location information $i_1$ to $i_7$ of seven sectors is stored in the location table 613 provided at one memory chip, the merit of the inventive concept may be provided.

In addition, finite field arithmetic (e.g., over a Galois field) may be performed to calculate an offset. Accordingly, it is desirable to store the location information $i_j$ using a vector $V(i_j)$ being a finite field element. Finite field expression of the location information will be more fully described with reference to FIG. 6.

The seed offset calculator 615a may calculate a random seed $S_j$ corresponding to random read-requested data Dread based upon the initial seed $V(S_0)$ and the random read location information $V(i_j)$ expressed by a finite field vector value. The seed offset calculator 615a may conduct the finite field arithmetic (e.g., over a Galois field). The seed offset calculator 615a may generate the seed $S_j$ of read requested data through finite field multiplication mainly performed over the finite field. The seed offset calculator 615a will be more fully described with reference to FIG. 7.

The random seed $S(i_j)$ generated by the seed offset calculator 615a will be expressed by the following equation.

$$S(i_j) = Tr_i^n(c\alpha^i) \quad (1)$$

In the equation, $Tr_i^n$ may indicate finite field (e.g., $GF(2^n)$) arithmetic, c may indicate a finite field element of the initial seed ($S_0$), and α may indicate a primitive element.

With the equation 1, a random seed $S(i_j)$ at a specific random read location may be a function of the initial seed $S_0$ and an offset $i_j$. To generate a seed of a random read location $i_j$, the initial seed S0 and the offset $i_j$ may be converted into a finite field value (c, $\alpha^{ij}$) under the condition that one initial seed is assigned to one page.

The de-randomizer 620a may generate the random sequence RS for de-randomizing random read data Dread using a seed value $S_j$ provided from the seed generator 610a. De-randomized data Dout may be output by mixing the random sequence RS and the random read data Dread. The de-randomizer 620a may include a sequence generator 621a and a mixer 623.

The sequence generator 621 may generate a random sequence using an input seed $S_j$ as an initial value. The sequence generator 621 may be formed of a linear feedback shift register (LSFR) which operates in a Fibonacci configuration. The sequence generator 621a may generate a random sequence RS to be used for randomization of random read-requested data Dread. The mixer 623 may output de-randomized data Dout by mixing the random read data and the random sequence RS. Herein, the de-randomized data may be output by XORing the random sequence RS and the random read data Dread.

With the above description, the seed generator 610a may generate a seed $S_j$, used to generate a random sequence, according to an initial seed $S_0$ assigned to each page and random read location information $i_j$. In other words, it is possible to obtain a seed $S_j$ of random read-requested data by combining an initial seed $S_0$ and random read location information without driving a sequence generator.

There was exemplarily described above the case that the location table 613 is configured to store sector location information $i_j$ using a finite field vector. However, the inventive concept is not limited thereto. The location table 613 can be implemented by an arithmetic block which is configured to receive location information $i_j$ and to output it using a finite field element. This arithmetic function will be expressed by the following equation 2.

$$V(i_j)=fv(i_j) \qquad (2)$$

Figure 5A:
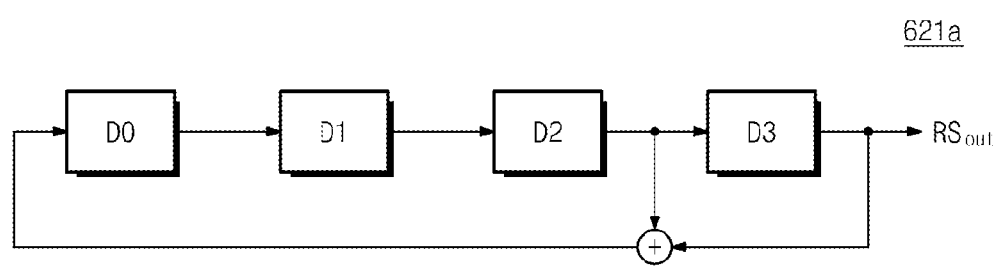

FIGS. 5A and 5B are diagrams for describing a sequence generator in FIG. 4, Referring to FIG. 5A, a sequence generator 621a may be formed of four flip-flops D0 to D3, and may generate a random sequence of a Fibonacci Configuration. A polynomial of the sequence generator 621a will be expressed by the following equation 3.

$$g(X)=X^4+X+1 \qquad (3)$$

That is, the sequence generator 621a may be formed of a linear feedback shift register LFSR including a plurality of flip-flops. Herein, binary values stored in the flip-flops (or, registers) D0 to D3 may constitute a seed value. A stream of bits output according to an increase in a clock cycle may become a random sequence RSout. Herein, a mixer may correspond to XOR logic.

A table of register values of the sequence generator 621a according to an increase in each clock cycle is illustrated in FIG. 5B. It is assumed that an initial value (T=0) of the flip-flops D0 to D3 in the sequence generator 621a is [1000]. Values of the flip-flops D0 to D3 may be identical to the initial value (T=0) after 15 clocks. Afterwards, data states of the flip-flops D0 to D3 may be varied in the same manner as data states of the flip-flops D0 to D3 are varied according to an increase in a clock cycle from T=0 to T=14. At this time, a stream of bits output from the flip-flop D3 may be provided as a random sequence.

However, this random sequence may be nothing but a random sequence of a Fibonacci Configuration. If it is necessary to process seeds in a finite field manner, algebraic conversion may be needed. For example, seed values converted over a Galois field are shown at a right side of FIG. 5B, Binary values such as a seed $S_j$ or location information may be converted in the same vector manner to process it over a specific vector space.

Figure 6:
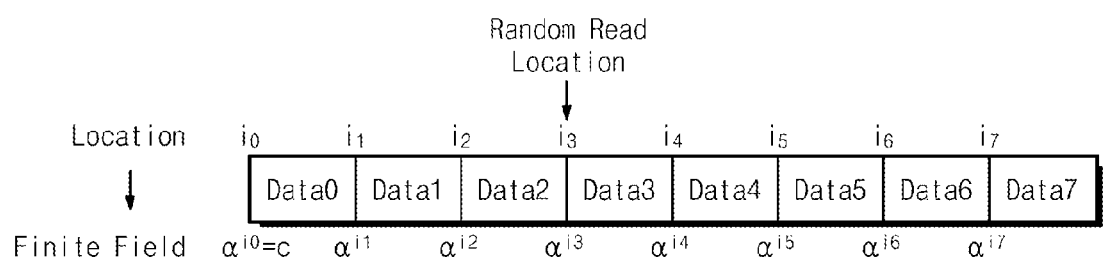
FIG. 6 is a diagram for describing a method of converting random read location information into a finite field element.

FIG. 6 is a diagram for describing a method of converting random read location information into a finite field element. Referring to FIG. 6, locations of sectors in a page may be converted to finite field elements. This conversion technique is illustrated in FIG. 5B. A mathematic expression of this relationship may correspond to the above-described equation 1. In the event that a random sequence is formed by a Fibonacci configuration, a location table 613 may provide finite field expressions $\alpha i_0=c, \alpha i_1, \alpha i_2, \ldots, \alpha i_7$ each corresponding to location information $i_1$ to $i_7$ of sectors. It is possible to form the location table 613 using function blocks capable of conducting one-to-one conversion with respect to the above-described finite field expressions.

Figure 7:
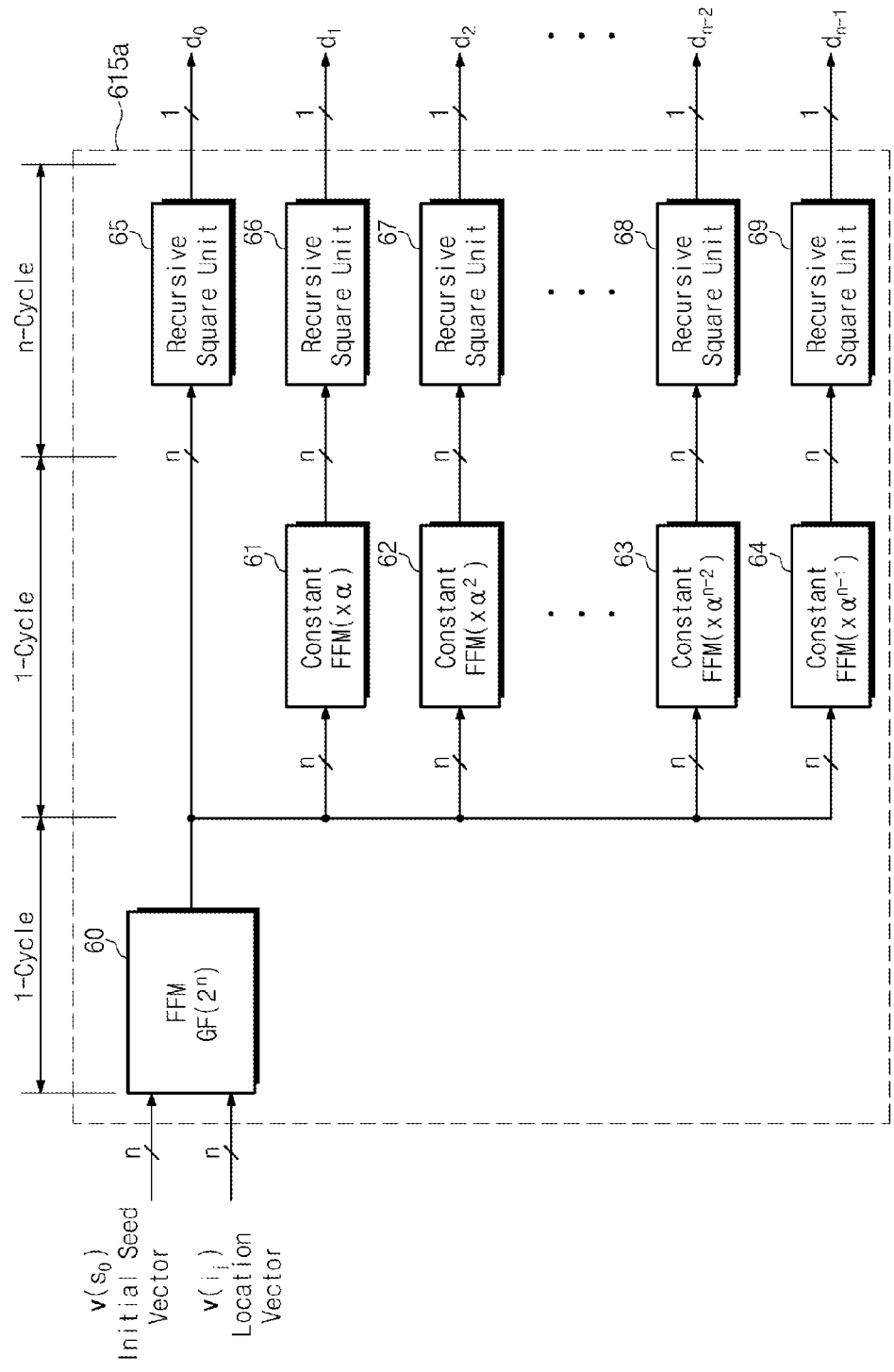
FIG. 7 is a block diagram illustrating a seed offset calculator in FIG. 4.

FIG. 7 is a block diagram illustrating a seed offset calculator in FIG. 4. Referring to FIG. 7, a seed offset calculator 615a may include finite field multipliers 60 to 64 and recursive square units 65 to 69.

The finite field multiplier 60 may multiply an initial seed vector $V(S_j)$ and a location vector $V(i_j)$ over a Galois field $GF(2^n)$. The finite field multiplier 60 may multiply elements of the initial seed vector $V(S_j)$ and elements of the location vector $V(i_j)$, respectively. An element of the Galois field $GF(2^n)$ may be expressed by a polynomial over the Galois field $GF(2^n)$. A circuit of multiplying primitive elements $\alpha$, $\alpha^2, \alpha, \ldots, \alpha^{n-1}$ may be implemented by an XOR gate. A final result may be output by a polynomial over the Galois field $GF(2^n)$ by connecting the circuit in an AND gate arrangement.

The finite field multipliers 61 to 64 may multiply an output of the finite field multiplier 60 and corresponding primitive elements 1, $\alpha$, $\alpha^2$, $\alpha^3$, $\ldots$, $\alpha^{n-1}$ to output results to the recursive square units 65 to 69, respectively. Since a primitive element of the finite field multiplier 61 is '1', an output of the finite field multiplier 60 may be transferred to the recursive square unit 65 without modification. The recursive square units 65 to 69 may perform a recursive square operation with respect to n-bit results output from the finite field multipliers 61 to 64, respectively. The recursive square units 65 to 69 may output 1-bit random sequences $d_0$ to $d_{n-1}$ according to results of the recursive square operation.

Figure 8A:
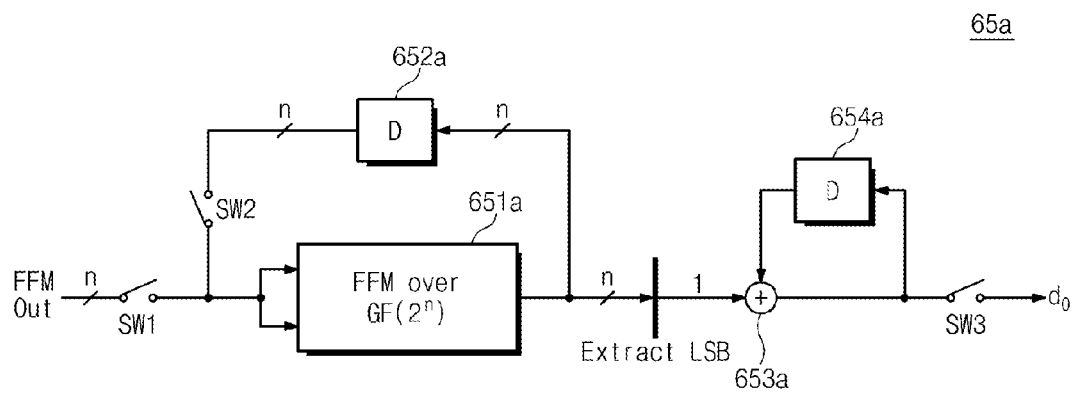
FIGS. 8A and 8B are block diagrams illustrating recursive square units in FIG. 7.
Figure 8B:
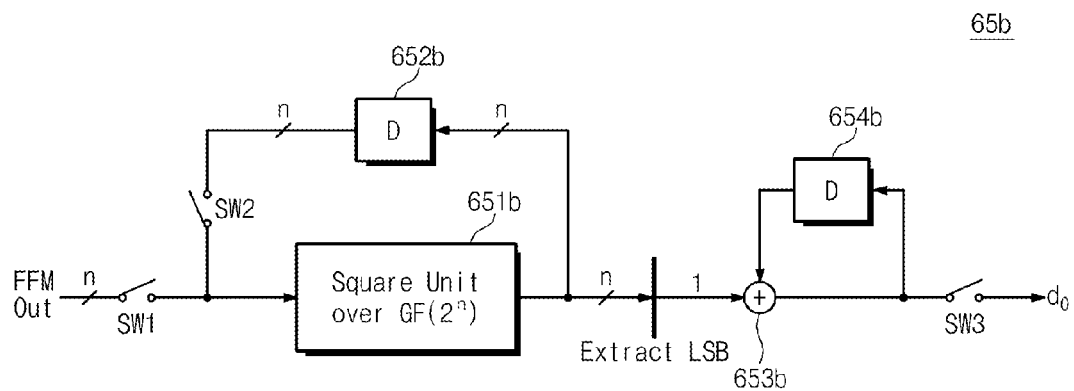

FIGS. 8A and 8B are block diagrams illustrating recursive square units in FIG. 7. Recursive square units 65 to 69 may perform finite field square arithmetic with respect to n-bit outputs from finite field multipliers 60 to 64. After multiplication of the n-bit outputs, an LSB value of the multiplied result may be output. The recursive square units 65 to 69 may be configured identically each other to perform the same function. For ease of description, one recursive square unit 65 will be more fully described.

Referring to FIG. 8A, the recursive square unit 65a may include a finite field multiplier 651a at a Galois field $GF(2^n)$. The recursive square unit 65a may further include switches SW1 and SW3 for controlling its input and output. The recursive square unit 65a may further include a switch SW2 for controlling a feedback operation. The recursive square unit 65a may include delay units 652a and 654a and an adder 653a. Below, the finite field multiplication arithmetic of the recursive square unit 65a on the n-bit data will be described.

First of all, at a first clock cycle, the switch SW1 may be opened and the switches SW2 and SW3 may be closed. With this condition, n-bit data may be provided to the recursive square unit 65a and output and feedback paths may be interrupted.

Following n clock cycles, the switches SW1 and SW3 may be closed and the switch SW2 may be opened. This may mean that input and output of the recursive square unit 65a are interrupted and the feedback path is formed. The n-bit data may be provided to the finite field multiplier 651a via two paths, and the finite field multiplier 651a may perform Galois field square arithmetic. Galois field multiplication may be repeated with a multiplied result being fed back during n clock cycles.

At a last one clock cycle, the switches SW1 and SW2 may be closed and the switch SW3 may be opened. With this condition, input and feedback paths of the recursive square unit 65a may be interrupted, and an output path may be formed. In particular, the finite field multiplier 651a may perform an operation of extracting an LSB value of n-bit data output at the last clock cycle. 1-bit corresponding to the LSB may be output as one bit $d_0$ of a seed offset.

Referring to FIG. 8B, the recursive square unit 65b may include a finite field multiplier 651b at a Galois field $GF(2^n)$. The recursive square unit 65b may further include switches SW1 and SW3 for controlling its input and output. The recursive square unit 65b may further include a switch SW2 for controlling a feedback operation. The recursive square unit 65b may include delay units 652b and 654b and an adder 653b. Below, the finite field multiplication arithmetic of the recursive square unit 65b on the n-bit data will be described.

First of all, at a first clock cycle, the switch SW1 may be opened and the switches SW2 and SW3 may be closed. With this condition, n-bit data may be provided to the recursive square unit 65b and output and feedback paths may be interrupted.

Following n clock cycles, the switches SW1 and SW3 may be closed and the switch SW2 may be opened. This may mean that input and output of the recursive square unit 65$b$ are interrupted and the feedback path is formed. Unlike the finite field multiplier 651$a$, the n-bit data may be provided to the finite field multiplier 651$b$ via one path, and the finite field multiplier 651$b$ may perform Galois field square arithmetic. Galois field multiplication may be repeated with a multiplied result being fed back during n clock cycles.

At a last one clock cycle, the switches SW1 and SW2 may be closed and the switch SW3 may be opened. With this condition, input and feedback paths of the recursive square unit 65$b$ may be interrupted, and an output path may be formed. In particular, the finite field multiplier 651$b$ may perform an operation of extracting an LSB value of n-bit data output at the last clock cycle. 1-bit corresponding to the LSB may be output as one bit do of a seed offset.

FIG. 9 is a flowchart for describing a de-randomizing method according to an exemplary embodiment of the inventive concept. Referring to FIG. 9, at a random read request, a randomizing and de-randomizing circuit 600$a$ may generate a seed $S_j$ on random read data based upon an initial seed $S_0$ and location information $i_j$. The random read data may be de-randomized using the seed $S_j$.

In step S110, the randomizing and de-randomizing circuit 600$a$ may receive random read location information corresponding to the random read request. The randomizing and de-randomizing circuit 600$a$ may judge random read location information based upon a column address provided at the random read request. Alternatively, in the event that a random read operation is performed in a sector unit, relative random read location information of a page may be determined according to a sector address. The random read location information may be determined by in a variety of different manners without limitation to this disclosure.

In step S120, the randomizing and de-randomizing circuit 600$a$ may determine an initial seed $S_0$ based upon an address of a page in which random read-requested data is included. An initial seed may be assigned to all pages of a memory device, respectively. This initial seed may be obtained from a spare region or a control information region at a read operation. A seed converter 611 may convert the initial seed $S_0$ generated by a Fibonacci Configuration into a finite field vector value. For example, the seed converter 611 may convert an initial seed $S_0$ assigned to each page into a Galois field vector $V(S_0)$.

In step S130, the randomizing and de-randomizing circuit 600$a$ may receive location information $i_j$ of the random read data. All pages may have the same location information $i_j$. For example, although initial seeds of pages are different, sectors of the pages at the same location may have the same random read location information $i_j$. Further, the location information $i_j$ may be provided using a finite field vector (e.g., a Galois field element) to perform finite field arithmetic. All location information $i_j$ having a finite field vector $V(i_j)$ format may be stored in a location table 613. Further, it is possible to provide location information having a finite field vector $V(i_j)$ format via an arithmetic unit for changing input location information $i_j$.

In step S140, a sequence generator 621$a$ may generate a random sequence RS using an input seed $V(S_j)$ as an initial value. The sequence generator 621$a$ may be formed of a liner feedback shift register LSFR which is configured to operate in a Fibonacci configuration.

In step S150, a mixer 623 may output de-randomized data Dout by mixing the random read data and the random sequence RS. Herein, the de-randomized data Dout may be output by XOR operation between the random read data Dread and the random sequence RS.

A sequence of steps S120 and S130 is not limited to this disclosure. For example, step S130 may be made prior to step S120. Alternatively, steps S130 and S120 may be made in parallel.

Figure 10:
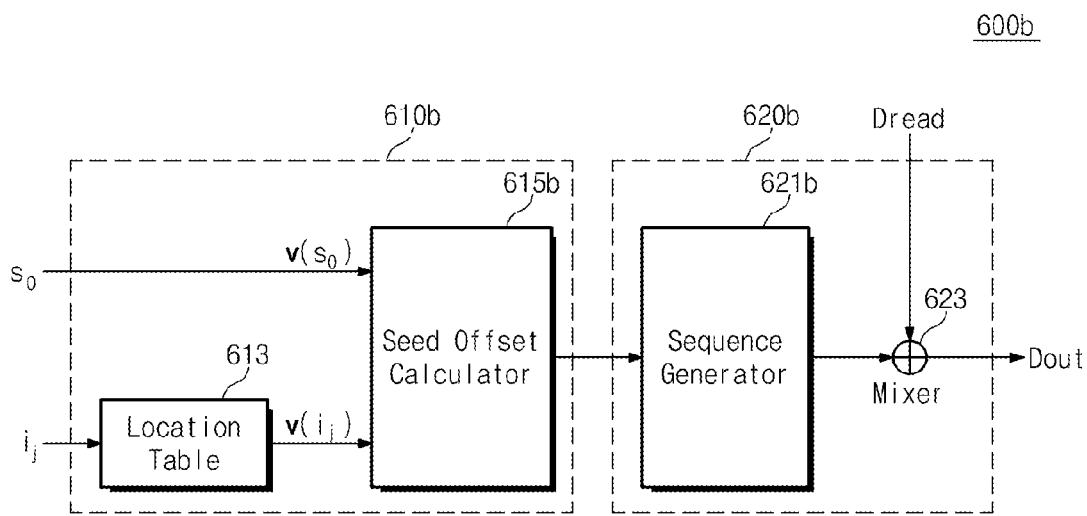
FIG. 10 is a block diagram illustrating a randomizing and de-randomizing circuit according to another exemplary embodiment of the inventive concept.

FIG. 10 is a block diagram illustrating a randomizing and de-randomizing circuit according to another exemplary embodiment of the inventive concept. Referring to FIG. 10, a randomizing and de-randomizing circuit 600$b$ may operate on the basis of a sequence generator 621$b$ which is driven according to a Galois Configuration.

A seed offset calculator 610$b$ may provide a seed $S_j$ corresponding to a random read location based upon an initial seed $S_0$ and random read location information $i_j$. The seed offset calculator 610$b$ may include a location table 613 and a seed offset calculator 615$b$. Herein, an initial seed $S_0$ generated by the Galois Configuration may be a vector which exists on a finite field vector. For this reason, it is unnecessary to additionally change the initial seed $S_0$ for finite field arithmetic. A conversion block for converting the initial seed S0 into a finite field vector may be unnecessary.

The location table 613 may store location information $i_j$ of a corresponding sector at a random read request. For example, a location of a sector provided at a random read request may have the same value with respect to all pages. This is because location information of a sector in a page has a relative value identically applied to each page. Accordingly, although initial seeds $S_0$ of pages are different, random read location information $i_j$ of sectors at the same location may be identical. For this reason, although location information of sectors in any page is stored in the location table 613, location information $i_j$ of sectors of all pages needed at one chip can be provided. In addition, in the even that finite field arithmetic (e.g., on a Galois field) may be performed to calculate a seed offset, it is desirable to store the location information $i_j$ using a vector $V(i_j)$ being finite field expression.

The seed offset calculator 615$b$ may calculate a random seed $S_j$ corresponding to random read-requested data Dread based upon the initial seed $V(S_0)$ and the random read location information $V(i_j)$ transferred by a finite field element. The seed offset calculator 615$b$ may operate according to the finite field arithmetic (e.g., over a Galois field). The seed offset calculator 615$b$ may generate the seed $S_j$ of read requested data through finite field multiplication mainly performed on the finite field. The seed offset calculator 615$b$ will be more fully described with reference to FIG. 11.

The de-randomizer 620$b$ may generate the random sequence RS for de-randomizing random read data Dread using a seed value $S_j$ provided from the seed offset calculator 610$b$. De-randomized data Dout may be output by mixing the random sequence RS and the random read data Dread. The de-randomizer 620$b$ may include a sequence generator 621$b$ and a mixer 623.

The sequence generator 621$b$ may generate a random sequence using an input seed $S_j$ as an initial value. The sequence generator 621$b$ may be formed of a linear feedback shift register (LSFR) which operates in a Fibonacci configuration. The sequence generator 621$b$ may generate a random sequence RS to be used for randomization of random read-requested data Dread. The mixer 623 may output de-randomized data Dout by mixing the random read data and the random sequence RS. Herein, the de-randomized data may be output by XOR operation between the random sequence RS and the random read data Dread.

With the above description, the seed offset calculator 610$b$ may generate a seed $S_j$, used to generate a random sequence, using an initial seed $S_0$ assigned to each page and random read location information $i_j$. In particular, the seed offset calculator 610b may generate a random seed $S_j$ by finite field multiplication without conversion on the initial seed $S_0$.

Figure 11:
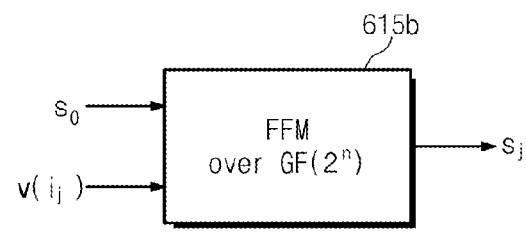
FIG. 11 is a block diagram illustrating a seed offset calculator in FIG. 10.

FIG. 11 is a block diagram illustrating a seed offset calculator in FIG. 10. Referring to FIG. 11, a seed offset calculator 615b may include a finite field multiplier FFM driven over a Galois field.

Since an initial seed $S_0$ generated by a Galois Configuration is a vector previously existing over a finite field vector, it is unnecessary to additionally change the initial seed $S_0$ for finite field arithmetic. Location information $V(i_j)$ provided by a finite field element via a location table or a converter may be easily processed by the finite field multiplier FFM. The finite field multiplier FFM may perform Galois field ($GF(2^n)$) multiplication on an initial seed vector $V(S_j)$ and a the location vector $V(i_j)$. The finite field multiplier FFM may multiply any two elements of the initial seed vector $V(S_j)$ and the location vector $V(i_j)$ changed into a finite field vector. An element of the Galois field $GF(2^n)$ may be expressed by a polynomial over the Galois field $GF(2^n)$. A circuit of multiplying a primitive element $\alpha$ and $\alpha^2, \alpha^3, \ldots, \alpha^{n-1}$ may be implemented by an XOR gate. An output of the finite field multiplier FFM may be output as a seed value $S_j$ of a random read-requested sector.

Figure 12A:
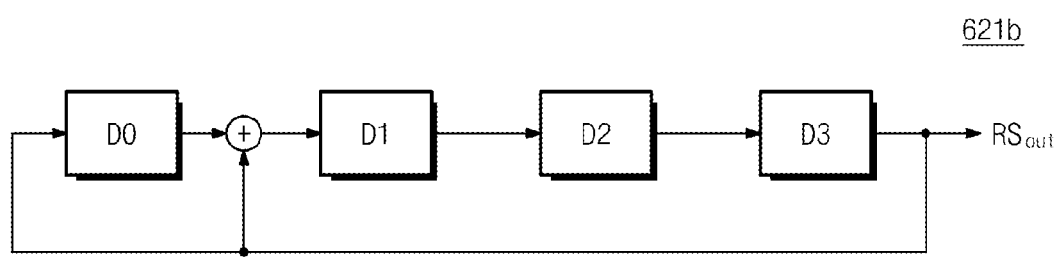

FIGS. 12A and 12B are diagrams for describing a sequence generator in FIG. 10. Referring to FIG. 12A, a sequence generator 621b may be formed of four shift registers D0 to D3, and may generate a random sequence of a Galois Configuration. A polynomial g(X) of the sequence generator 621b will be expressed the same as the equation 3.

The sequence generator 621b may be formed of a linear feedback shift register LFSR including a plurality of flip-flops. Herein, binary values stored in the flip-flops (or, registers) D0 to D3 may constitute a seed ($S_j$) value. A stream of bits output according to an increase in a clock cycle may become a random sequence RSout. Herein, a mixer may correspond to XOR logic.

A table of register values of the sequence generator 621b according to an increase in each clock cycle is illustrated in FIG. 12B. It is assumed that an initial value (T=0) of the flip-flops (or, registers) D0 to D3 in the sequence generator 621b is [1000]. Values of the flip-flops D0 to D3 may be identical to the initial value (T=0) after 15 clock cycles. Afterwards, data states of the flip-flops D0 to D3 may be varied in the same manner as data states of the flip-flops D0 to D3 are varied according to an increase in a clock cycle from T=0 to T=14. At this time, a stream of bits output from the flip-flop D3 may be provided as a random sequence.

With the sequence generator 621b of the Galois configuration, values of the flip-flops D0 to D3 may be identical to those by the Galois field ($GF(2^n)$) arithmetic. This means that the initial seed $S_0$ itself is a vector included in a Galois field. Accordingly, it is possible to transfer the initial seed $S_0$ to the seed offset calculator 615b without conversion.

Figure 13:
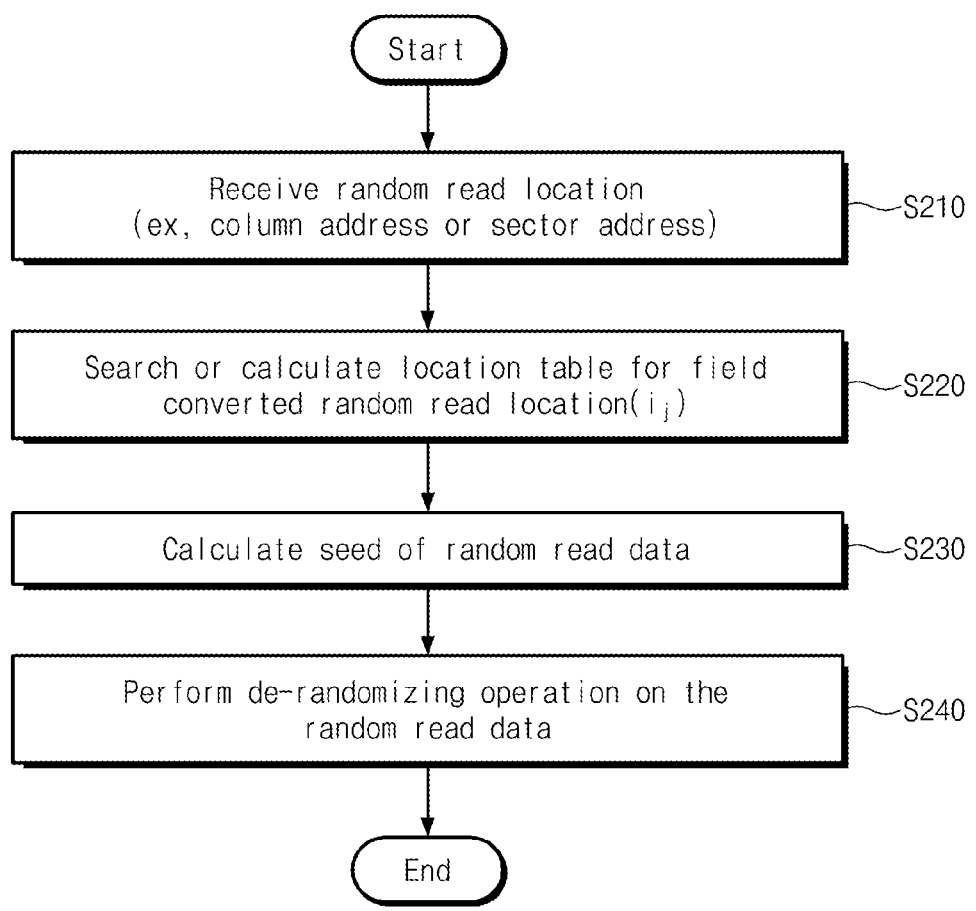
FIG. 13 is a flowchart for describing a de-randomizing method according to another exemplary embodiment of the inventive concept.

FIG. 13 is a flowchart for describing a de-randomizing method according to another exemplary embodiment of the inventive concept. Referring to FIG. 13, at a random read request, a randomizing and de-randomizing circuit 600b may generate a seed $S_j$ on random read data based upon an initial seed $S_0$ and location information $i_j$. The random read data may be de-randomized using the seed $S_j$.

In step S210, the randomizing and de-randomizing circuit 600b may receive random read location information corresponding to the random read request. The randomizing and de-randomizing circuit 600b may judge random read location information based upon a column address provided at the random read request. Alternatively, in the event that a random read operation is performed in a sector unit, relative random read location information of a page may be determined according to a sector address. The random read location information may be determined in a variety of different manners without limitation to this disclosure.

In step S220, the randomizing and de-randomizing circuit 600b may receive location information $i_j$ of the random read data. All pages may have the same location information $i_j$. For example, although initial seeds of pages are different, sectors of the pages at the same location may have the same random read location information $i_j$. Further, the location information $i_j$ may be provided using a finite field vector to perform finite field arithmetic. All location information $i_j$ having a finite field vector $V(i_j)$ format may be stored in a location table 613. Further, it is possible to provide location information having a finite field vector $V(i_j)$ format via an arithmetic unit for changing input location information $i_j$.

In step S230, a seed offset calculator 615b may calculate a random seed $S_j$ corresponding to random read-requested data Dread based upon the initial seed $V(S_0)$ and the random read location information $V(i_j)$ transferred by a finite field element. The seed offset calculator 615b may generate the seed $S_j$ of a read-requested sector using finite field multiplication mainly executed over a Galois field.

In step S240, a de-randomizer 620b may generate a random sequence and may perform a de-randomizing operation using the random sequence. A mixer 623 may output de-randomized data Dout by mixing the random read data and the random sequence RS. Herein, the de-randomized data Dout may be output by XOR operation between the random read data Dread and the random sequence RS.

With the above description, it is possible to skip the process of converting an initial seed $S_0$ into a finite field vector.

Figure 14:
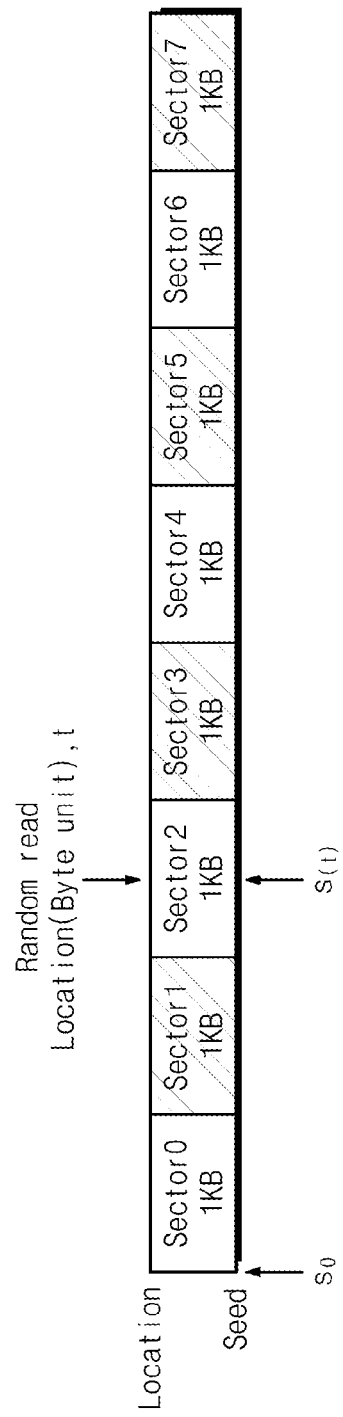
FIG. 14 is a diagram for describing a random read operation, executed in a byte unit, according to an exemplary embodiment of the inventive concept.

FIG. 14 is a diagram for describing a random read operation, executed in a byte unit, according to an exemplary embodiment of the inventive concept. In FIG. 3, there was described the case that a random read operation is executed in a sector unit. However, a random read unit, that is, a start point of a random read operation may be determined not only by a start point of a sector but also in a byte unit. In this case, a lookup table may be formed of seed offset values on random read locations $i_k$ of a byte unit. If a random read location t in a sector is expressed by a relative value, a size of a lookup table may be minimized.

That is, if a specific byte location in a sector (e.g., Sector 2) is set to a start address of a random read operation, a random seed S(t) corresponding to the specific byte location will be expressed by the following equation 4.

$$S(t)=Tr_1^n(c\alpha^t) \quad (4)$$

In the equation, $Tr_1^n$ may indicate finite field ($GF(2^n)$) arithmetic, c may indicate a finite field element of an initial seed ($S_0$), and $\alpha$ may indicate a primitive element. Conversion of the initial seed $S_0$ and the start location t into a finite field value may be needed to calculate a random seed S(t) at a random read operation executed in a byte unit. Finite field conversion values $\alpha^t$ on start locations of the random read operation may be stored in a simple lookup table via multi-step page division. This will be more fully described with reference to FIGS. 15 and 16.

Figure 15:
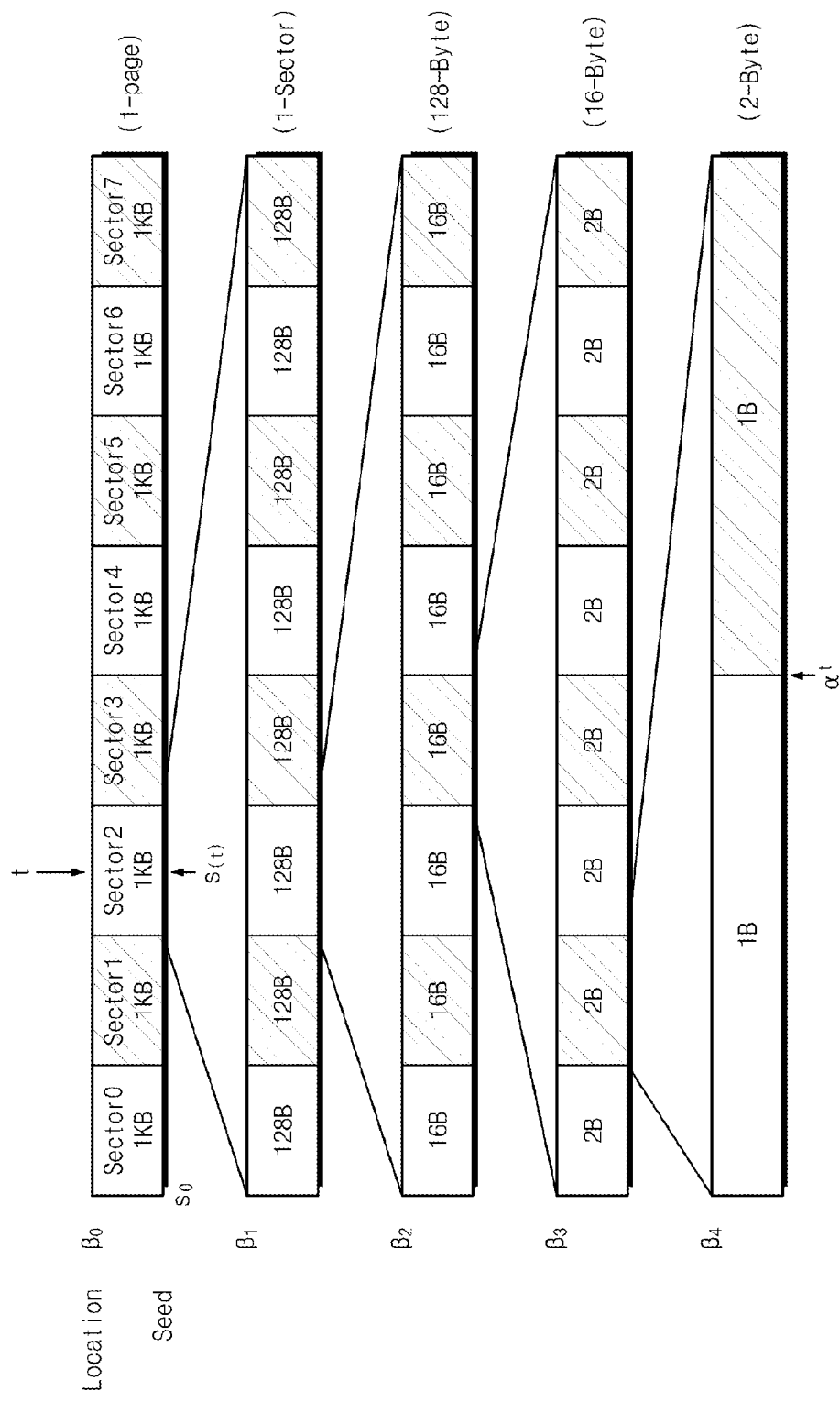
FIG. 15 is a diagram for describing a method of dividing data locations when a random read operation is performed in a byte unit.

FIG. 15 is a diagram for describing a method of dividing data locations when a random read operation is performed in a byte unit. Referring to FIG. 15, one page may be divided into a plurality of, for example, eight sectors. Relative location information of each of sectors in a page may be expressed by the first element $\beta_0$. Each sector may be divided into sub-sectors each having a size of 128 bytes. Relative location information of each of sub-sectors in a sector may be expressed by the second element $\beta_1$. Each sub-sector may be divided into 16-byte (B) data. Relative location information of each 16B-data in a sub-sector may be expressed by the third element $\beta_2$. Each 16B-data may be divided into 2B-data. Relative location information of each 2B-data in 16B-data may be expressed by the fourth element $\beta_3$. Each 2B-data may be divided into 1B-data. Relative location information of each 1B-data in 2B-data may be expressed by the fifth element $\beta_4$.

Accordingly, in a random read operation executed in a byte unit, location information may be expressed using the first to fifth elements $\beta_0$ to $\beta_4$ expressed by a finite field element. The inventive concept, however, is not limited to the 5-step division manner. A table of location information t of a random read operation executed in a byte unit may be configured using an M-step division manner (M being an integer less or more than 5).

FIG. 16 is a diagram illustrating finite field location information described in FIG. 15. If location information t is provided at a random read operation, the first to fifth elements $\beta_0$ to $\beta_4$ being a finite field element may be selected. If finite field multiplication is performed with respect to the first to fifth elements $\beta_0$ to $\beta_4$ selected from a table, a finite field conversion value $\alpha^t$ on the location information t may be generated.

FIG. 17 is a diagram illustrating a seed offset calculator of calculating a finite field conversion value $\alpha^t$ described in FIG. 16 and a seed offset. If an initial seed $S_0$ is provided by a finite field element c, a random seed S(t) may be generated by multiplying the first to fifth elements $\beta_0$ to $\beta_4$ provided from a table in FIG. 16 and an initial seed.

As understood from the above description, it is possible to easily configure a table for storing random read location information in the case where a random read operation executed in a byte unit.

With the above description, although an access to random data is requested from a random read location, it is possible to rapidly provide a random sequence corresponding to the random read location. Accordingly, the read performance of the nonvolatile memory device may be improved.

Figure 18:
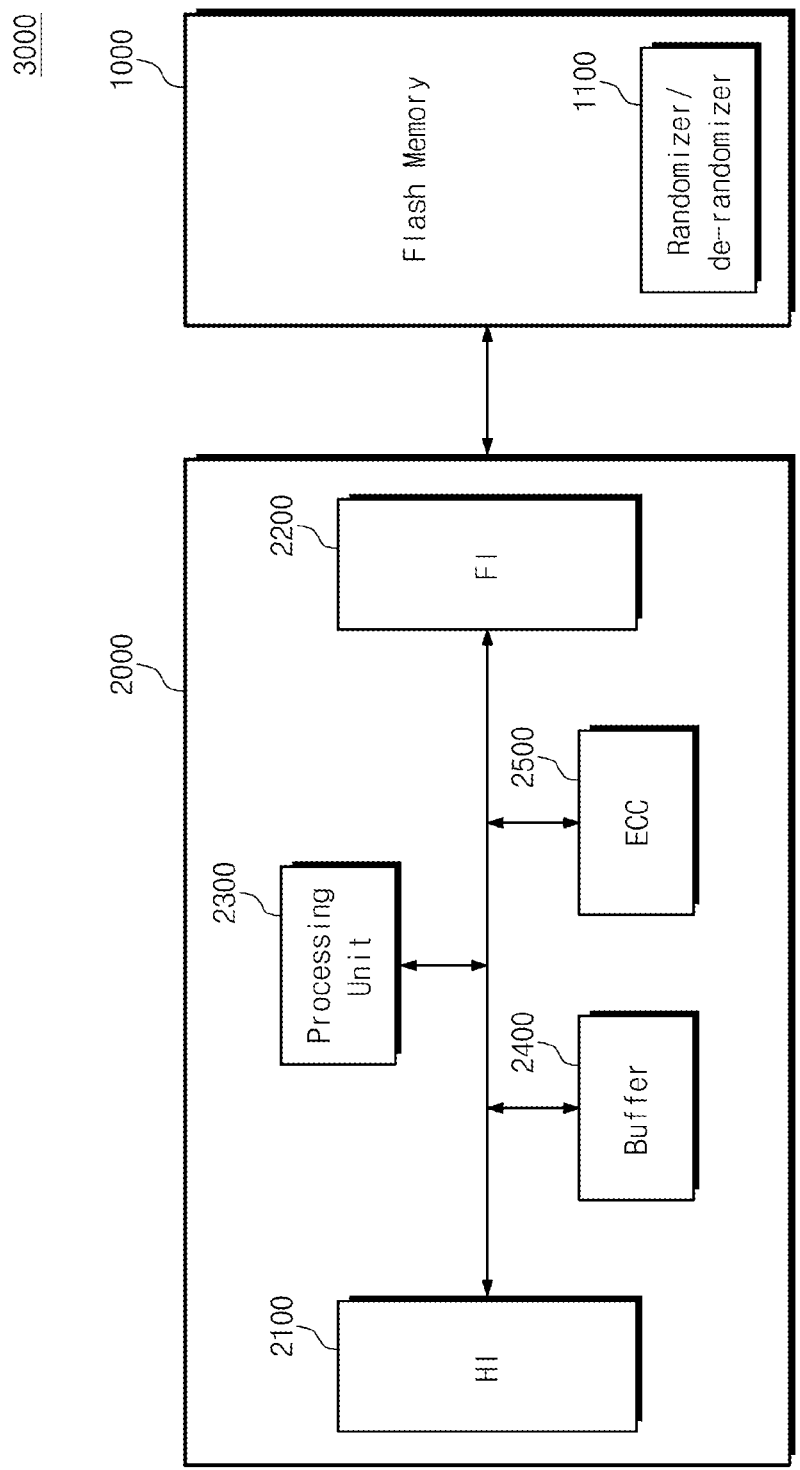
FIG. 18 is a block diagram illustrating a memory system according to an exemplary embodiment of the inventive concept.

FIG. 18 is a block diagram illustrating a memory system according to an exemplary embodiment of the inventive concept. Referring to FIG. 18, a memory system 3000 may include at least one flash memory 1000 and a controller 2000.

The flash memory 1000 may operate under the control of the controller 2000, and may be used as a storage medium. The controller 2000 may be configured to control the flash memory 1000. The flash memory 1000 may include a randomizing and de-randomizing circuit 1100. The flash memory 1000 in FIG. 18 may be substantially identical to that illustrated in FIG. 1, and a description thereof is thus omitted. The controller 2000 may be configured to add ECC data to data to be stored in the flash memory 1000.

The controller 2000 may include the first interface 2100, the second interface 2200, a processing unit 2300, a buffer memory 2400, and an ECC block 2500. The first interface 2100 may be configured to interface with an external device (for example, a host), and the second interface 2200 may be configured to interface with the flash memory 1000. The processing unit 2300 may be configured to control an overall operation of the controller 2000. The buffer memory 2400 may be configured to store data to be stored in the flash memory 1000 or data read out from the flash memory 1000. The ECC block 2500 may generate ECC data based upon data from the buffer memory 2400. The ECC block 2600 may perform error detecting and correcting operations with respect to data read from the flash memory 1000. The ECC data may be stored in the same page as data to be stored in the flash memory 1000 or in a region different from data to be stored in the flash memory 1000.

In case of a memory system in FIG. 18, a write operation may include generating ECC data based on data to be stored in the flash memory 1000 and randomizing the data to be stored in the flash memory 1000. A read operation may include de-randomizing read data and performing error detecting and correcting operations with respect to read data (that is, randomized data). Randomizing/de-randomizing of ECC data may be made selectively.

In an exemplary embodiment, the first interface 2100 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, HyperTransport, etc. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. The iFCP-Peripheral bus standards may include Apple Desktop Bus, HIL, MIDI, Multibus, RS-232, DMX512-A, EIA/RS-422, IEEE-1284, UNDO, 1-Wire, I2C, SPI, EIA/RS-485, USB, Camera Link, External PCIe, Light Peak, Multidrop Bus, etc.

Figure 19:
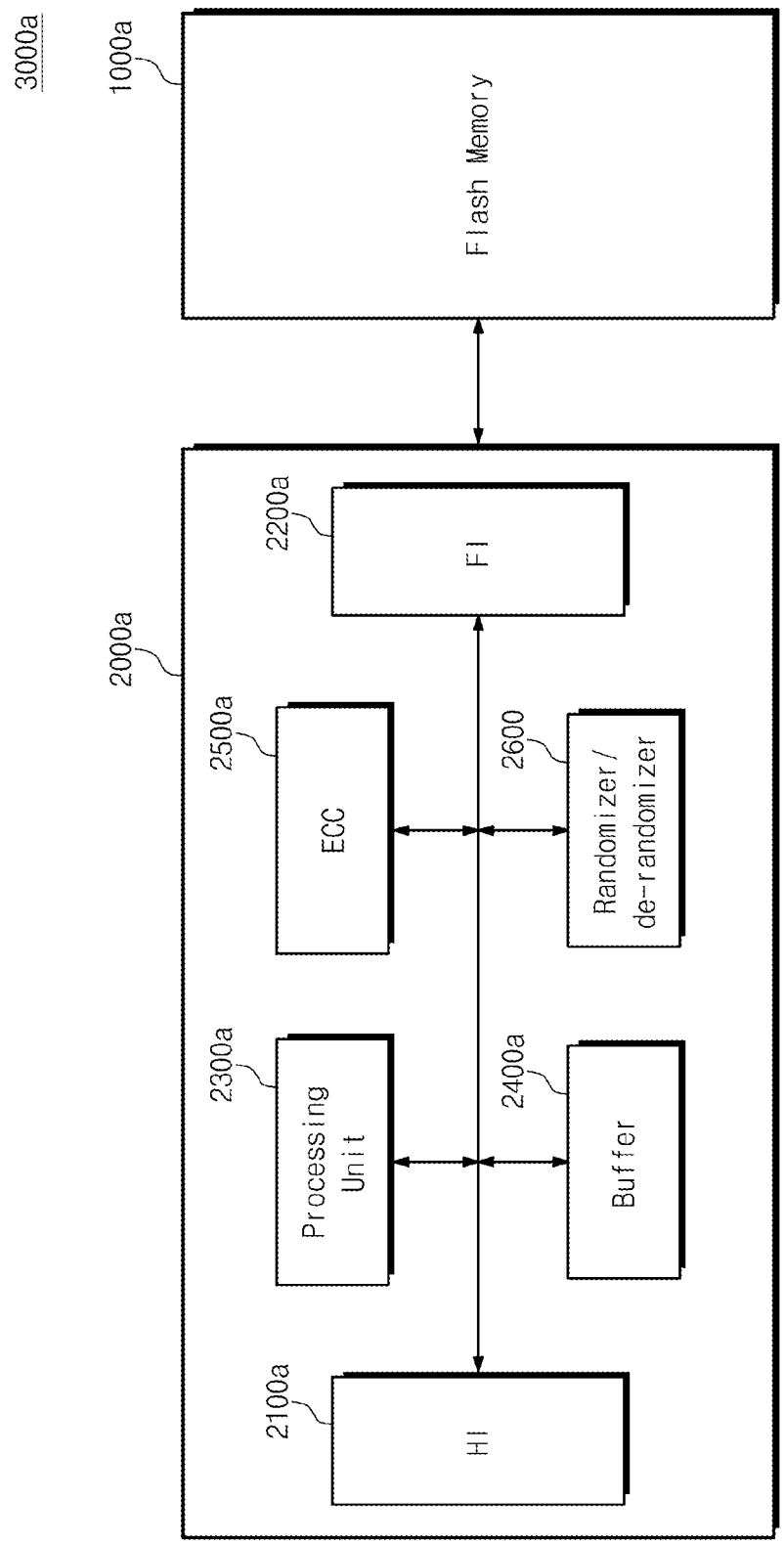
FIG. 19 is a block diagram illustrating a memory system according to another exemplary embodiment of the inventive concept.

FIG. 19 is a block diagram illustrating a memory system according to another exemplary embodiment of the inventive concept. Referring to FIG. 19, a memory system 3000a may include at least one flash memory 1000a and a controller 2000a. The flash memory 1000a may operate under the control of the controller 2000a, and may be used as a storage medium. The flash memory 1000a illustrated in FIG. 19 does not include the above-described randomizing and de-randomizing circuit. The controller 2000a may be configured to control the flash memory 1000a. The controller 2000a may be configured to randomize data to be stored in the flash memory 1000a and to add ECC data to the randomized data. The controller 2000a may be configured to perform detecting and correcting operations with respect to errors of randomized data read out from the flash memory 1000a and to de-randomize randomized data.

The controller 2000a may include the first interface 2100a, the second interface 2200a, a processing unit 2300a, a buffer memory 2400a, an ECC block 2500a, and a randomizing and de-randomizing block 2600. The constituent elements 2100a, 2200a, 2300a, 2400a, and 2500a illustrated in FIG. 19 may be substantially identical to those in FIG. 18 except for the following difference, and description thereof is thus omitted.

The randomizing and de-randomizing block 2600 may be configured to randomize data from the buffer memory 2400a and to de-randomize data (that is, randomized data) read out from the flash memory 1000a. The randomizing and de-randomizing block 2600 may perform randomizing and de-randomizing operations with respect to random data according to any one of manners described in FIGS. 1 to 17, and description thereof is thus omitted. The ECC block 2500a may generate ECC data based upon randomized data from the randomizing and de-randomizing block 2600. The ECC block 2500a may perform error detecting and correcting operations on data read from the flash memory 1000a, that is, randomized data, based upon ECC data. The ECC data may be stored in the same page as data to be stored in the flash memory 1000a or in a region different from data to be stored in the flash memory 1000a.

In case of a memory system in FIG. 19, a write operation may include randomizing data to be stored in the flash memory 1000a, generating ECC data based on the randomized data, and storing the randomized data and the ECC data in the flash memory 1000. Alternatively, a write operation may include randomizing both data to be stored and ECC data and storing the randomized result. A read operation may include performing error detecting and correcting operations with respect to read data (that is, randomized data) based on ECC data and randomizing the read data.

Figure 20:
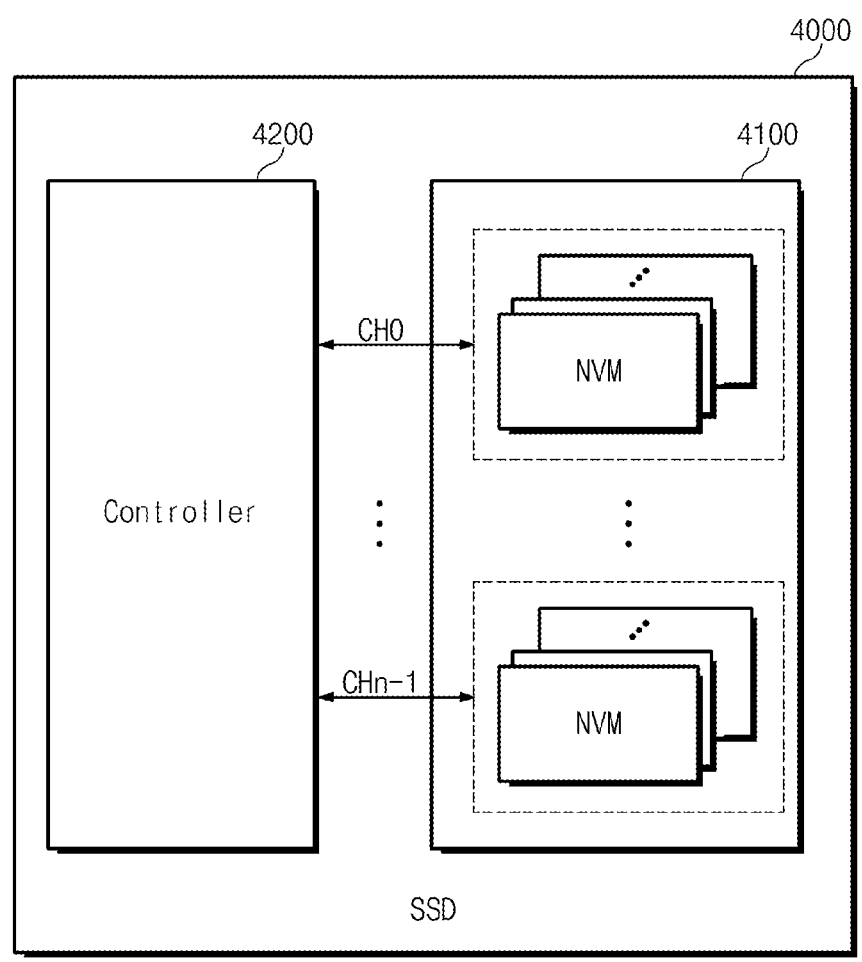
FIG. 20 is a block diagram showing a solid state drive according to an exemplary embodiment of the inventive concept.

FIG. 20 is a block diagram showing a solid state drive according to an exemplary embodiment of the inventive concept. Referring to FIG. 20, a solid state drive (SSD) 4000 may comprise a storage medium 4100 and a controller 4200. The storage medium 4100 may be connected with the controller 4200 via a plurality of channels CH0 to CHn−1, each of which is connected in common with a plurality of nonvolatile memories NVM. Each nonvolatile memory NVM may be formed of a flash memory described in FIG. 1. In this case, the controller 4200 may be configured the same as that in FIG. 18. That is, data randomizing and de-randomizing may be made within each nonvolatile memory, and error detecting and correcting may be made within the controller 4200.

Alternatively, the controller 4200 may be configured the same as that described in FIG. 19. In this case, data randomizing and de-randomizing and error detecting and correcting may be made within the controller 4200. Accordingly, it is possible to generate an initial seed for random data based upon an offset address.

Figure 21:
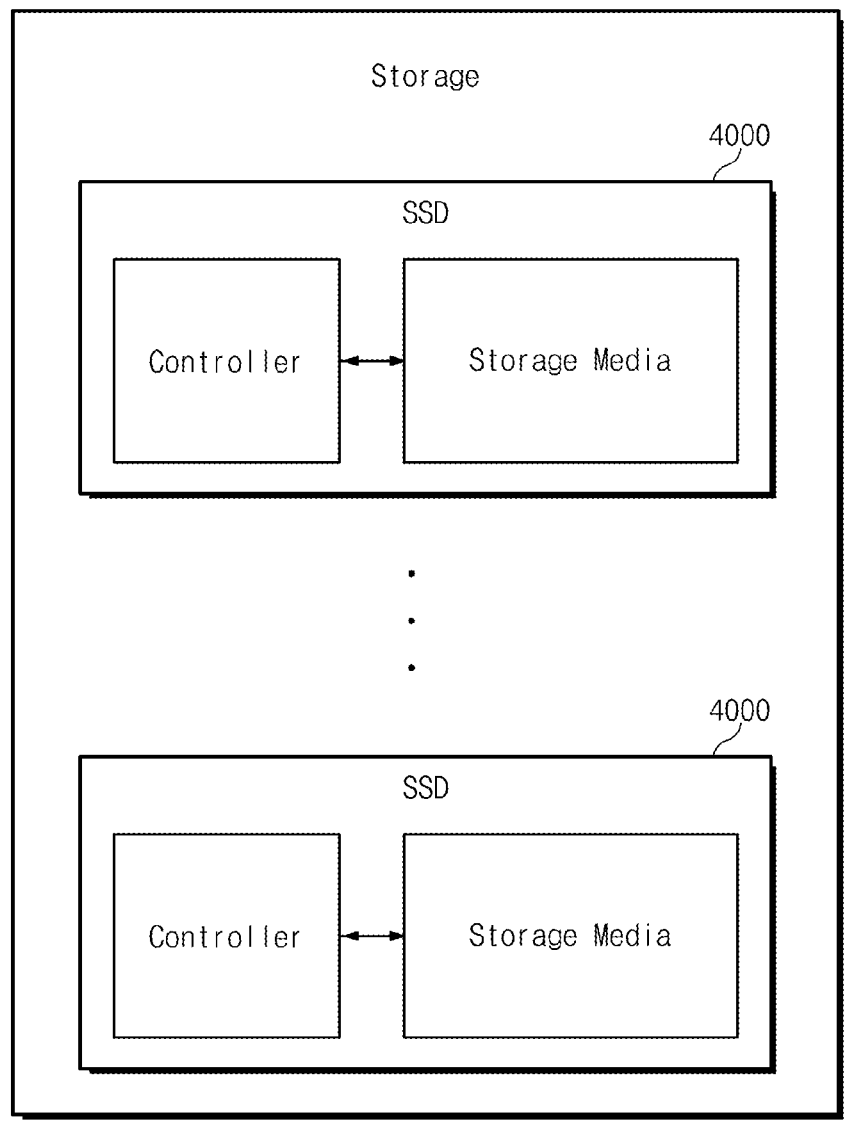
FIG. 21 is a block diagram showing a storage using a solid state drive illustrated in FIG. 20.
Figure 22:
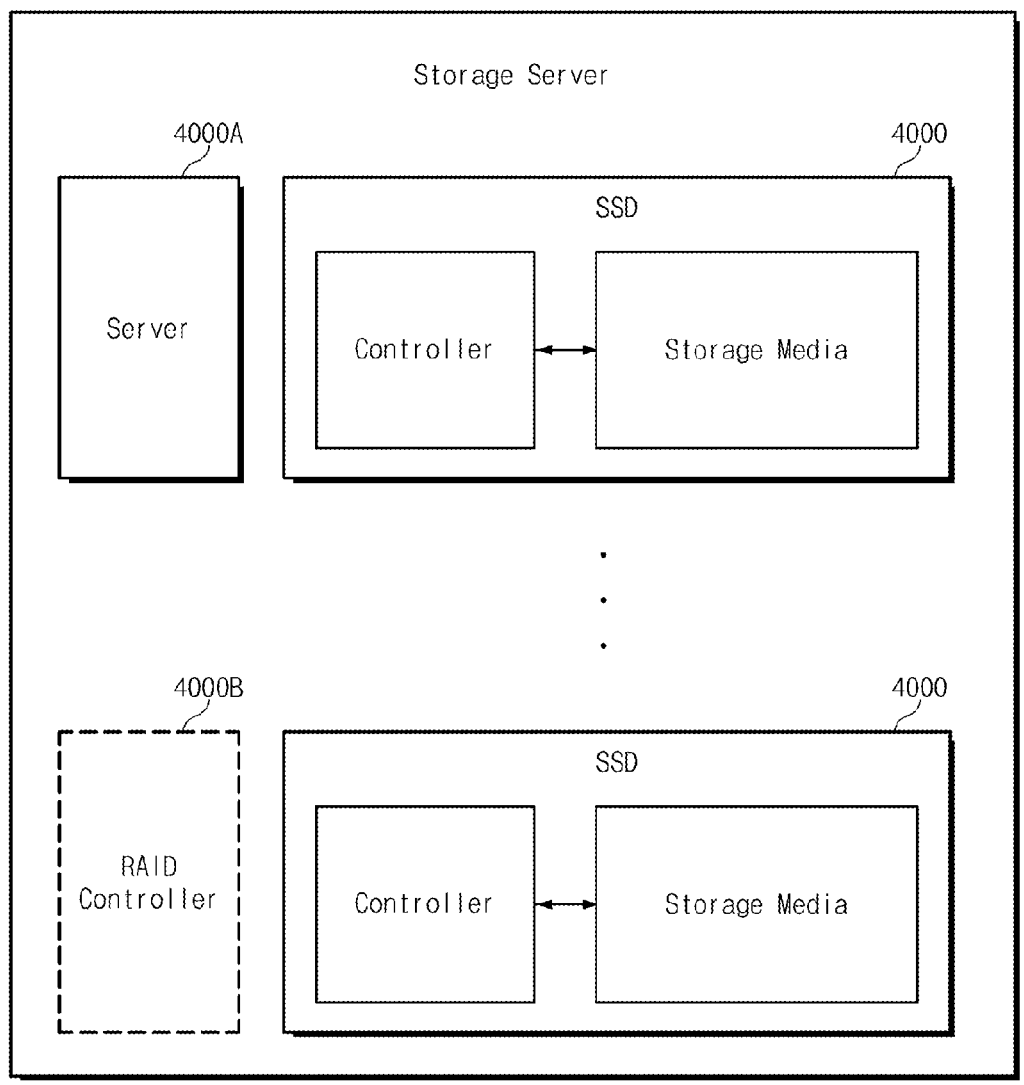
FIG. 22 is a block diagram showing a storage server using a solid state drive illustrated in FIG. 20.

FIG. 21 is a block diagram showing a storage using a solid state drive illustrated in FIG. 20, and FIG. 22 is a block diagram showing a storage server using a solid state drive illustrated in FIG. 20.

An SSD 4000 according to an exemplary embodiment of the inventive concept may be used to configure the storage. As illustrated in FIG. 21, the storage may include a plurality of solid state drives 4000 each of which is configured the same as that described in FIG. 20. The SSD 4000 according to an exemplary embodiment of the inventive concept may be used to configure a storage sever. As illustrated in FIG. 22, a storage server may include a plurality of solid state drives 4000, each of which is configured the same as that described in FIG. 20, and a server 4000A for controlling an overall operation of the storage server. Further, it is well comprehended that the storage server further includes a RAID controller 4000B for parity management according to a parity manner applied to repair defects on data stored in the solid state drives 4000.

Figure 23:
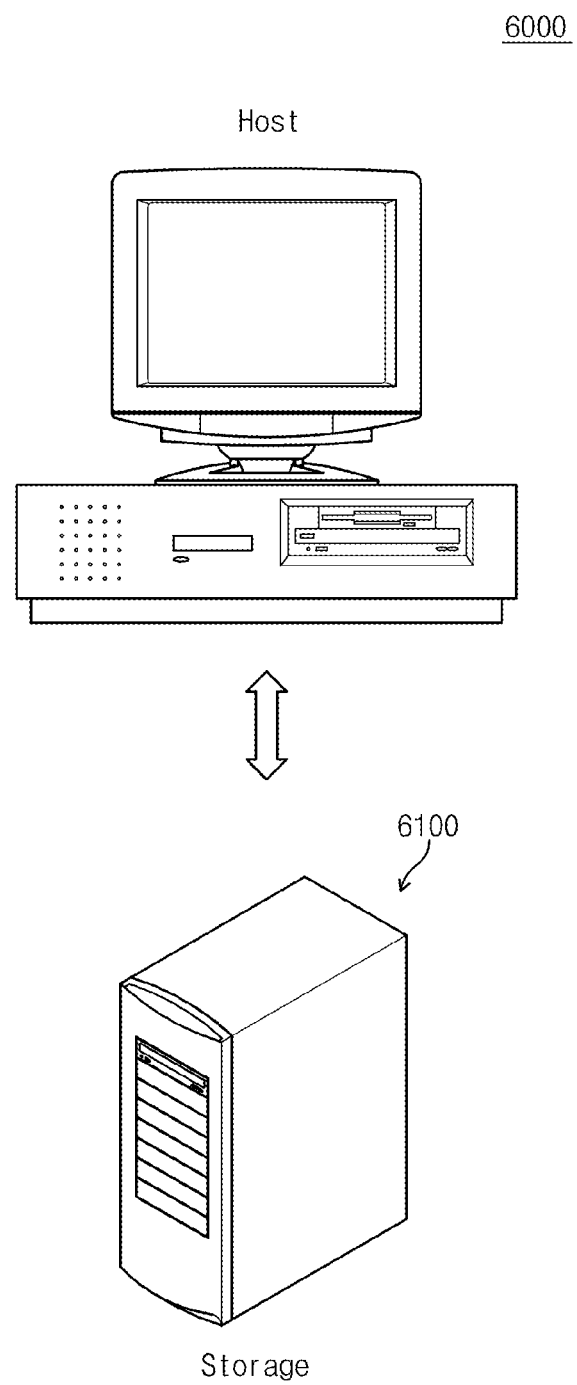
FIGS. 23 to 25 are diagrams showing systems according to exemplary embodiments of the inventive concept.
Figure 24:
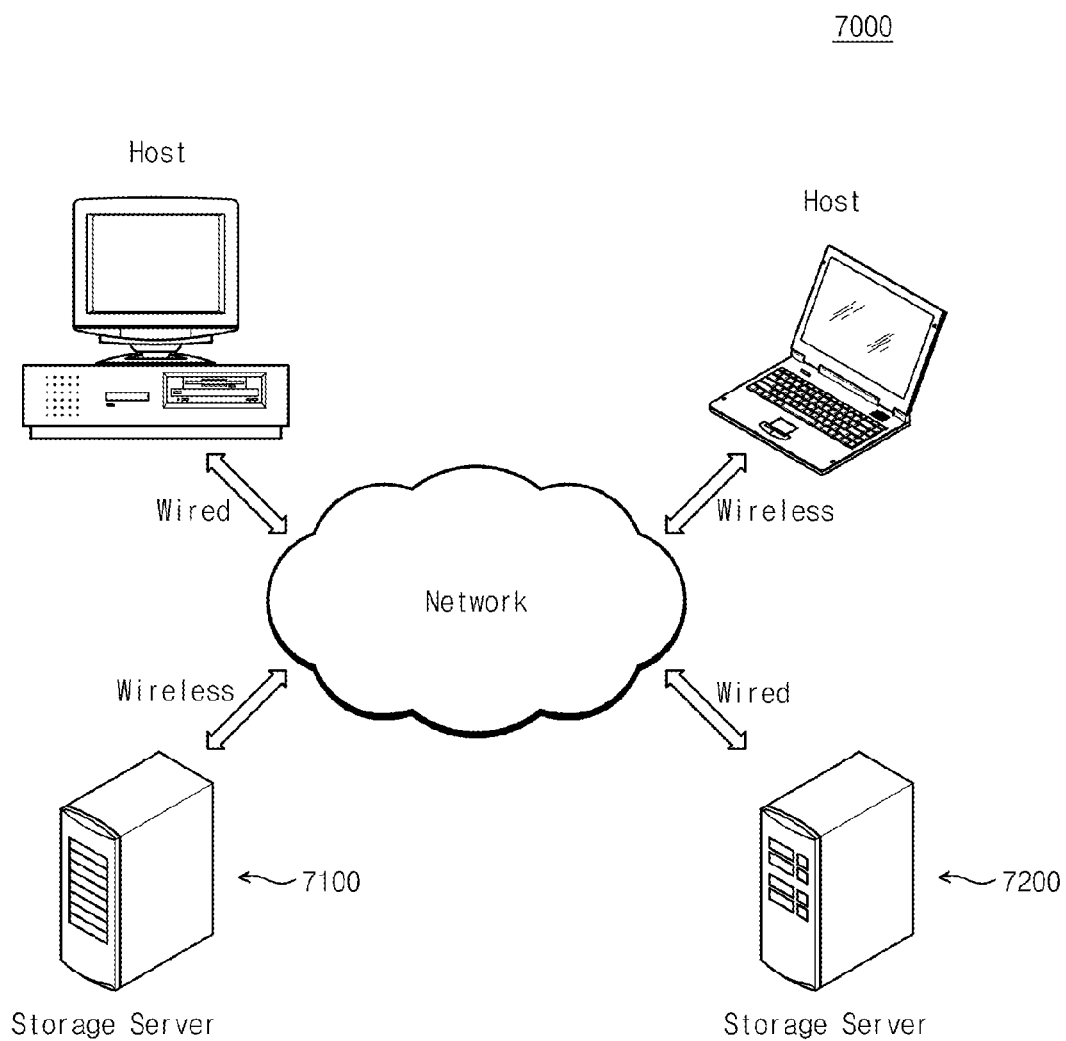
Figure 25:
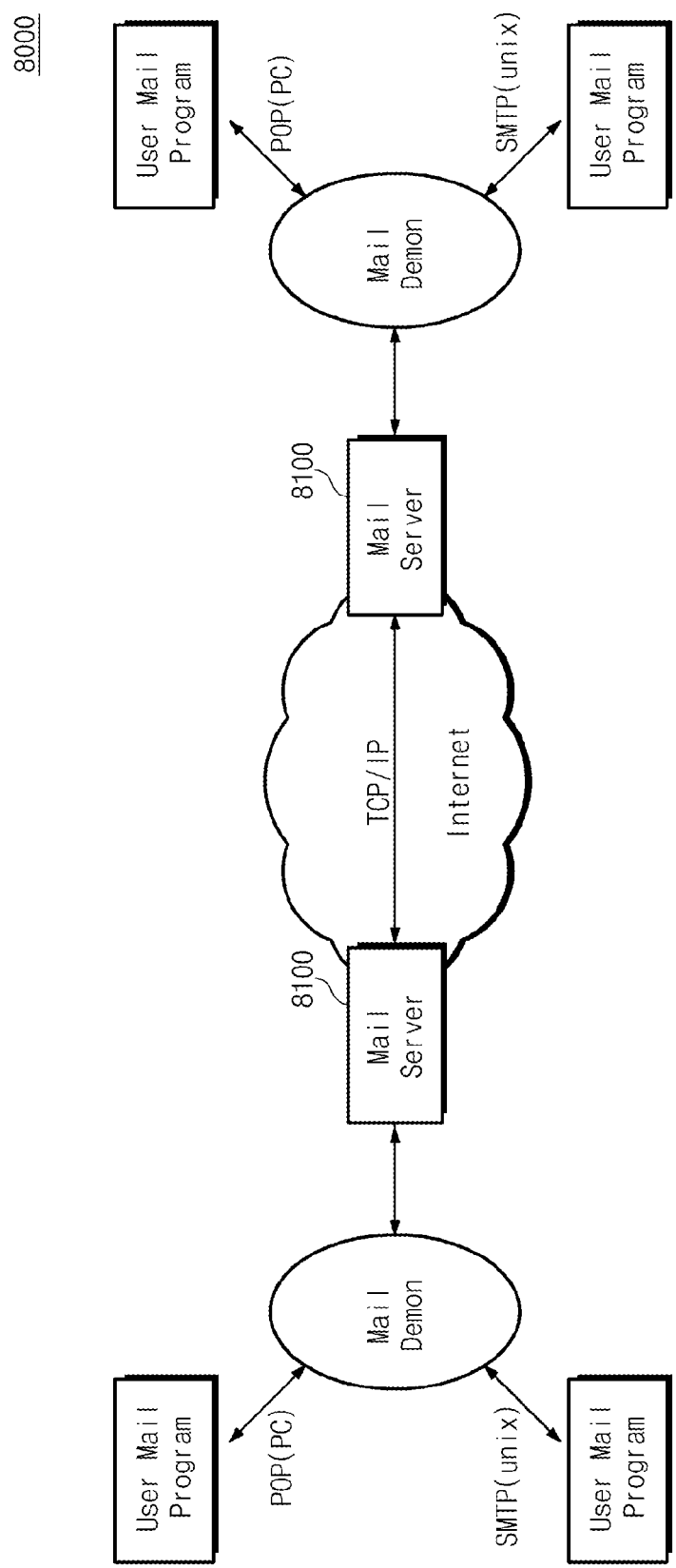

FIGS. 23 to 25 are diagrams showing systems according to exemplary embodiments of the inventive concept.

In the event that a solid state drive including a memory controller and flash memory devices according to exemplary embodiments of the inventive concept is applied to storage, as illustrated in FIG. 23, a system 600 may include a storage 6100 which communicates with a host by a wire or wireless manner. In a case where a solid state drive according to exemplary embodiments of the inventive concept is applied to a storage server, as illustrated in FIG. 24, a system 7000 may include storage servers 7100 and 7200 which communicate with a host by a wire or wireless manner. Further, as illustrated in FIG. 25, a solid state drive including a data storage device according to exemplary embodiments of the inventive concept can be applied to a mail server 8100. The mail server 8100 may communicate with mail programs via a mail demon connected in POP and SMTP manners, and the mail servers 8100 may communicate through an internet network.

FIGS. 26 to 30 are diagrams showing other systems to which a nonvolatile memory device according to an exemplary embodiment of the inventive concept is applied.

Figure 26:
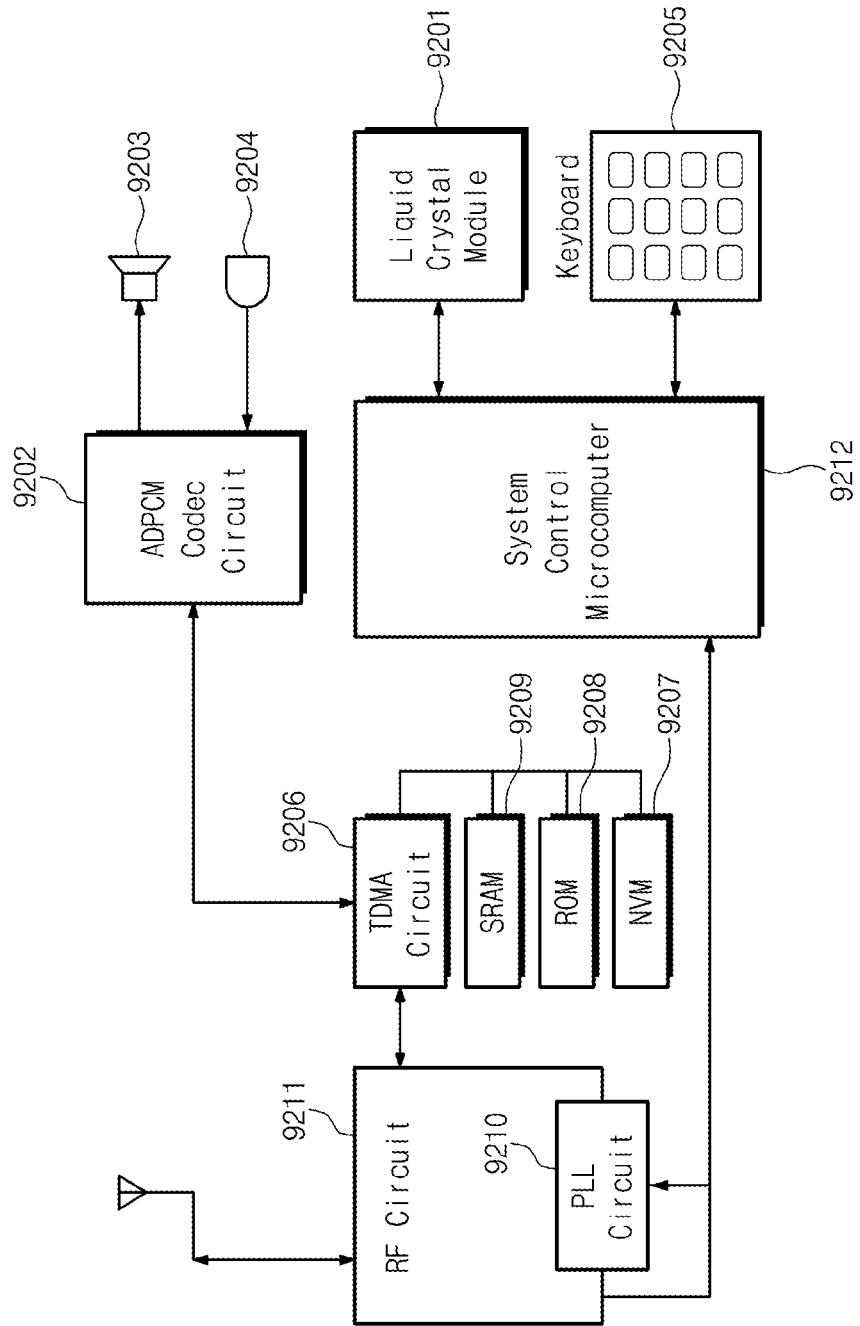
FIGS. 26 to 30 are diagrams showing other systems to which a nonvolatile memory device according to an exemplary embodiment of the inventive concept is applied.

FIG. 26 is a block diagram illustrating a cellular phone system to which a flash memory device according to an exemplary embodiment of the inventive concept is applied. Referring to FIG. 26, a cellular phone system may include an ADPCM codec circuit 9202 for compressing a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system may include various types of memories, such as the flash memory device 9207 as a nonvolatile memory device, the ROM 9208, and the SRAM 9209. As a memory device 9207 of the cellular phone system, a flash memory device described in FIG. 1 may be used. That is, it is possible to generate an initial seed for random data. The ROM 9208 may be used to store programs, and the SRAM 9209 may be used as a working region for the system control microcomputer 9212 or/and to temporarily store data. Herein, the system control microcomputer 9212 may be a processor which is configured to control write and read operations of the flash memory device 9207.

Figure 27:
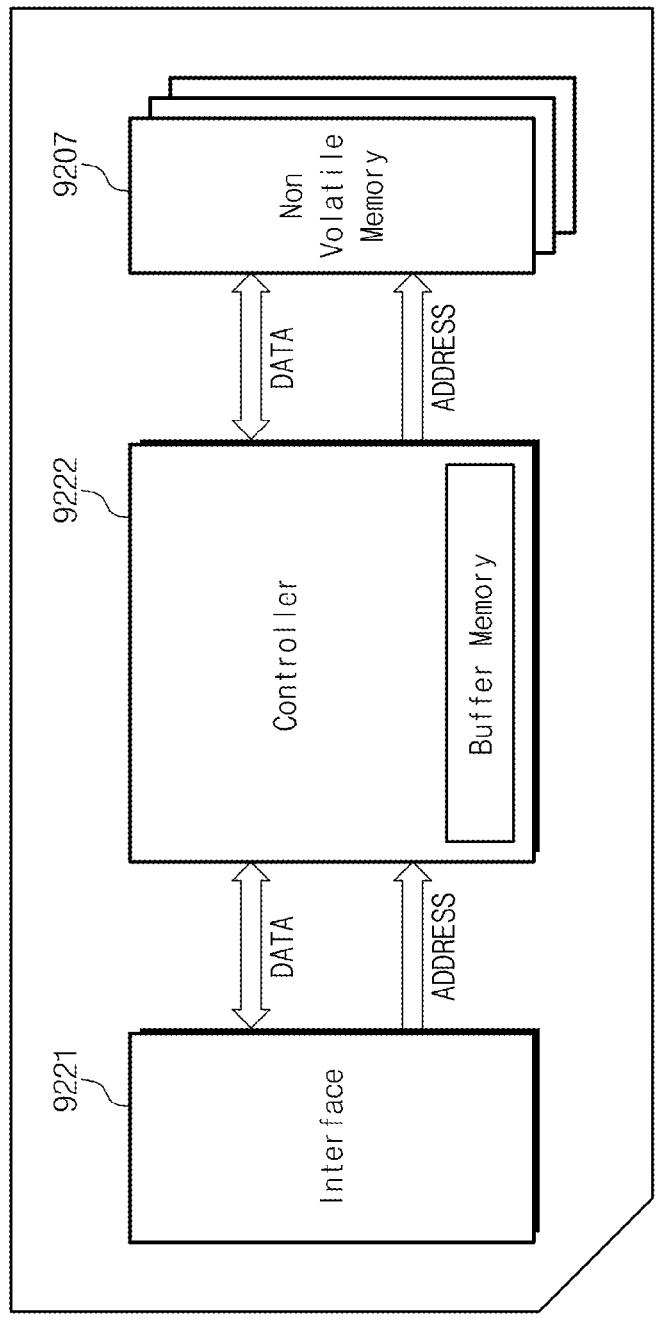

FIG. 27 is a block diagram illustrating a memory card to which a flash memory device according to an exemplary embodiment of the inventive concept is applied. A memory card, for example, may be an MMC card, an SD card, a multiuse card, a micro-SD card, a memory stick, a compact SD card, an ID card, a PCMCIA card, an SSD card, a chip-card, a smartcard, an USB card, an MCP-type embedded card storage, or the like. The MCP-type embedded card storage may include an eMMC (embedded MMC), an Esd (embedded SD), an eSSD (embedded SSD), a PPN (Perfect Page NAND), and the like.

Referring to FIG. 27, the memory card may include an interface circuit 9221 for interfacing with an external device, a controller 9222 including a buffer memory and controlling an operation of the memory card, and at least one flash memory device 9207 according to an exemplary embodiment of the inventive concept. The flash memory device 9207 may be configured to generate an initial seed for random data. The controller 9222 may be a processor which is configured to control write and read operations of the flash memory device 9207. In particular, the controller 9222 may be coupled with the nonvolatile memory device 9207 and the interface circuit 9221 via a data bus DATA and an address bus ADDRESS.

Figure 28:
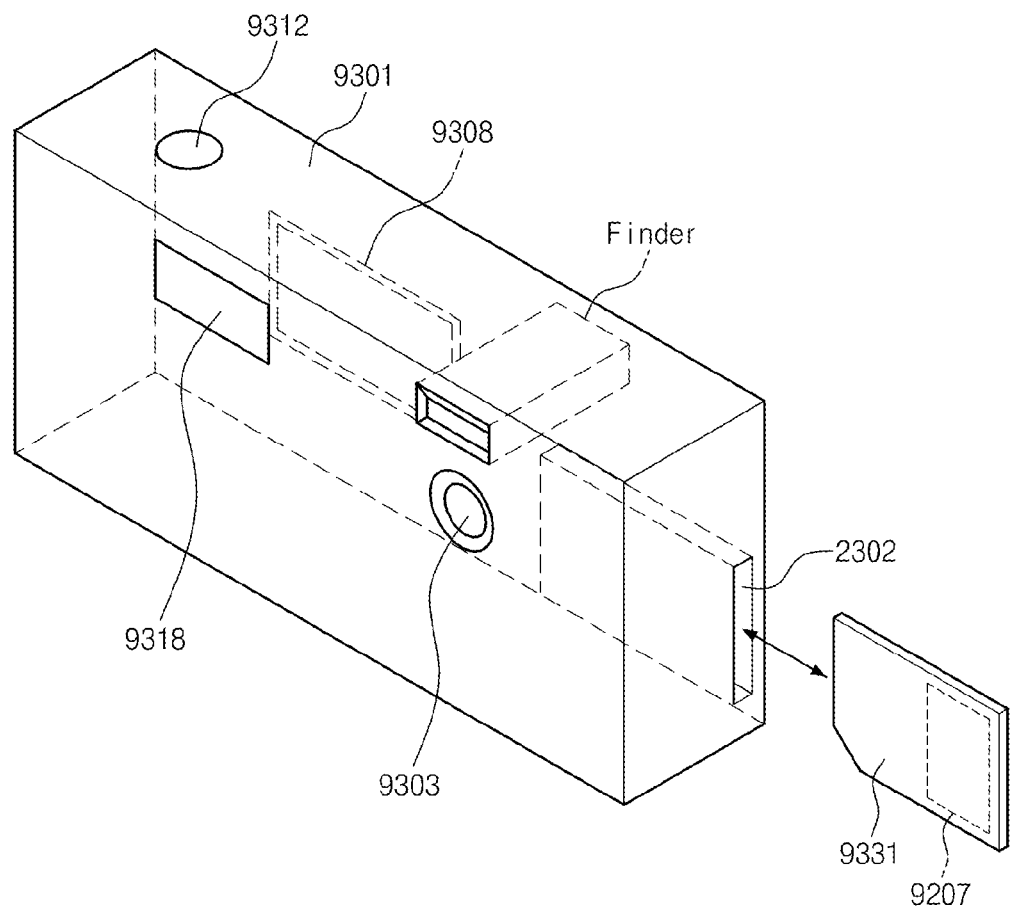

FIG. 28 is a block diagram illustrating a digital still camera to which a flash memory device according to an exemplary embodiment of the inventive concept is applied.

Referring to FIG. 28, a digital still camera may include a body 9301, a slot 2302, a lens 9303, a display circuit 9308, a shutter button 9312, a strobe 9318, and the like. In particular, a memory card 9331 may be inserted in the slot 2302, and may include at least one flash memory device 9207 according to an exemplary embodiment of the inventive concept configured to generate an initial seed for random data. If the memory card 9331 has a contact type, an electric circuit on a circuit board may be electrically contacted with the memory card 9331 when inserted in the slot 2302. In the event that the memory card 9331 has a non-contact type, an electric circuit on a circuit board may communicate with the memory card 9331 in a radio-frequency manner.

Figure 29:
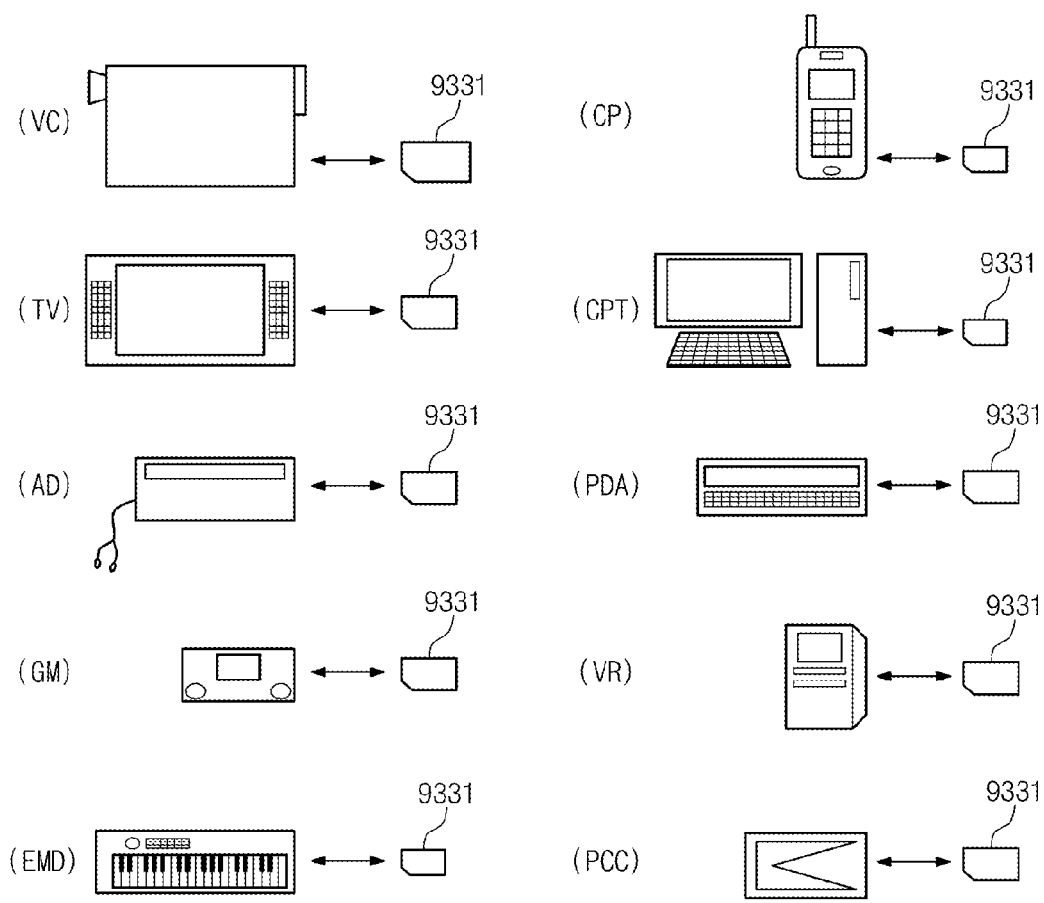

FIG. 29 is a diagram illustrating various systems to which a memory card in FIG. 28 is applied.

Referring to FIG. 29, a memory card 9331 may be applied to a video camera VC, a television TV, an audio device AD, a game machine GM, an electronic music device EMD, a cellular phone CP, a computer CPT, a Personal Digital Assistant PDA, a voice recorder VR, a PC card PCC, and the like.

Figure 30:
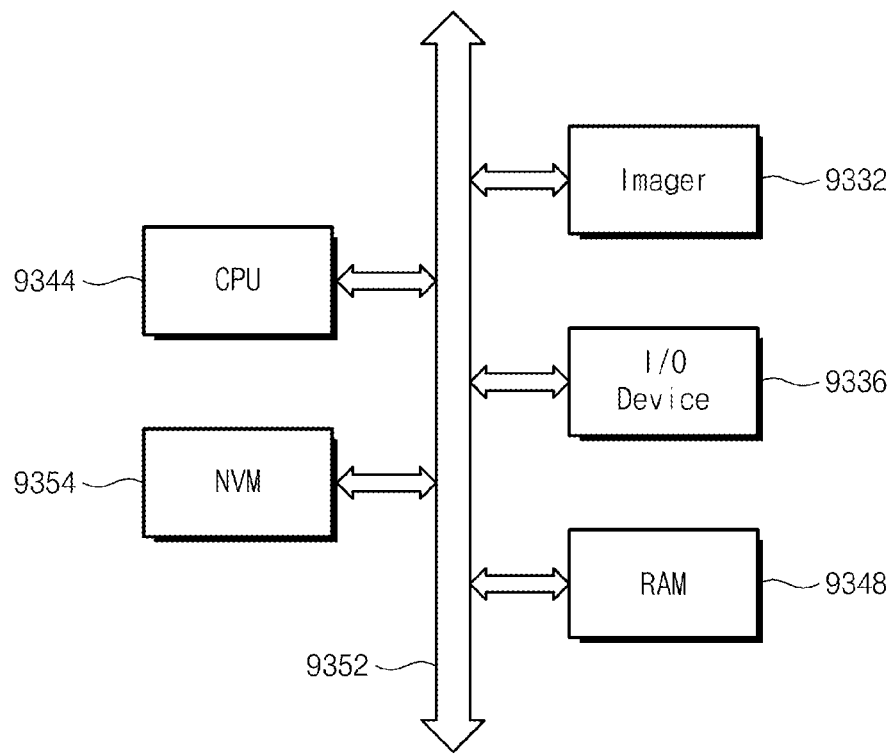

FIG. 30 is a block diagram illustrating an image sensor system to which a flash memory device according to an exemplary embodiment of the inventive concept is applied.

Referring to FIG. 30, an image sensor system may include an image sensor 9332, an input/output device 9336, RAM 9348, CPU 9344, and a flash memory device 9354 according to an exemplary embodiment of the inventive concept. The flash memory device 9354 may be configured to generate an initial seed for random data. Elements, that is, the image sensor 9332, the input/output device 9336, the RAM 9348, the CPU 9344, and the flash memory device 9354 may communicate with one another via a bus 9352. The image sensor 9332 may include a photo sensing device such as a photogate, photo-diode, or the like. Each element may be formed of a single chip together with a processor or independently from the processor.

In an exemplary embodiment, memory cells can be formed of a variable resistance memory cell. In another exemplary embodiment, memory cells can be formed of one of various cell structures having a charge storage layer. Cell structures having a charge storage layer may include a charge trap flash structure using a charge trap layer, a stack flash structure in which arrays are stacked in a multiple layer, a source-drain free flash structure, a pin-type flash structure, etc.

A flash memory device and/or a memory controller according to the inventive concept may be packed using various types of packages. For example, a flash memory device and/or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of reading data in a nonvolatile memory system that comprises a plurality of pages including a first page, the first page including a plurality of sectors, the plurality of sectors including a first sector and a second sector, an address of the first sector preceding an address of the second sector, the method comprising:
receiving a read request for reading data in the second sector, the read request including a page address corresponding to the first page and a sector address corresponding to the second sector;
generating a first seed based on the page address;
generating a second seed based on the first seed and on the sector address;
generating a second random sequence corresponding to the data in the second sector based on the second seed; and
generating output data based on the second random sequence and on the data in the second sector,
wherein a first random sequence corresponding to data in the first sector is not generated in response to the read request for reading the data in the second sector.

2. The method of claim 1, wherein each of the plurality of pages includes two sectors, four sectors, eight sectors, or sixteen sectors.

3. The method of claim 1, wherein the second seed is generated by a finite field arithmetic.

4. The method of claim 1, further comprising converting the first seed into a finite field element.

5. The method of claim 1, wherein the data in the second sector is randomized data, and
the generating the output data includes derandomizing the data in the second sector.

6. The method of claim 1, further comprising reading first page data in the first page, storing the first page data into a buffer, and using the data in the second sector of the first page that is stored in the buffer.

7. The method of claim 6, further comprising performing error detecting and correcting operations with respect to the first page data.

8. The method of claim 1, wherein data in each of the plurality of sectors is error correction code (ECC) data.

9. A nonvolatile memory system, comprising:
a memory cell array including a plurality of pages, each of the plurality of pages including a plurality of sectors, the plurality of sectors including a first sector and a second sector; and
a controller configured to derandomize first data in the first sector corresponding to a page address and to a first sector address, the controller being configured to generate a first seed based on the page address and on the first sector address, the controller being configured to generate a first random sequence using the first seed, the controller being configured to generate derandomized data based on the first random sequence and on the first data in the first sector.

10. The nonvolatile memory system of claim 9, wherein the memory cell array is included in a flash memory of the nonvolatile memory system, and
the nonvolatile memory system is a solid state drive.

11. The nonvolatile memory system of claim 9, wherein the controller is configured to generate an initial seed based on the page address, and to generate the first seed based on the initial seed and on the first sector address.

12. The nonvolatile memory system of claim 9, wherein the controller includes a volatile memory configured to store data that is read from the memory cell array.

13. The nonvolatile memory system of claim 9, wherein the controller includes an error correction code (ECC) block configured to perform error detecting and correcting operations with respect to data read from the memory cell array.

14. The nonvolatile memory system of claim 9, wherein the first data is randomized data, and
the controller is configured to randomize data that is to be stored in the memory cell array.

15. The nonvolatile memory system of claim 9, wherein the controller is configured to receive a read request for reading the first data, the read request including the page address and the first sector address,
an address of the second sector precedes an address of the first sector, and a second random sequence corresponding to data in the second sector is not generated in response to the read request for reading the first data.

16. A method of reading data in a nonvolatile memory system, comprising:
   receiving a read request for reading first data in a first memory array in the nonvolatile memory system, the read request including a first page address and a first column address corresponding to the first memory array;
   generating a first seed based on the first page address and the first column address;
   generating a first random sequence using the first seed; and
   generating output data based on the first random sequence and on the first data.

17. The method of claim 16, wherein the first memory array is included in a first page, the first page further including a second memory array, an address of the second memory array preceding an address of the first memory array,
   the first random sequence corresponds to the first data, and
   a second random sequence corresponding to second data in the second memory array is not generated in response to the read request for reading the first data.

18. The method of claim 17, further comprising performing error detecting and correcting operations with respect to first page data in the first page.

19. The method of claim 16, wherein the generating the first seed comprises generating an initial seed based on the first page address and generating the first seed based on the initial seed and the first column address.

20. The method of claim 16, wherein the first data in the first memory array is randomized data, and
   the generating the output data includes derandomizing the first data.

21. The method of claim 1, wherein a length of each of the plurality of sectors is variable.

22. The method of claim 1, wherein the generating the first seed based on the page address includes using the page address as the first seed.

23. The method of claim 1, wherein the generating the first seed based on the page address includes calculating the first seed using the page address.

* * * * *